(12) United States Patent
Lee et al.

(10) Patent No.: US 7,091,137 B2
(45) Date of Patent: *Aug. 15, 2006

(54) BI-LAYER APPROACH FOR A HERMETIC LOW DIELECTRIC CONSTANT LAYER FOR BARRIER APPLICATIONS

(75) Inventors: Albert Lee, Cupertino, CA (US); Annamalai Lakshmanan, Santa Clara, CA (US); Bok Hoen Kim, San Jose, CA (US); Li-Qun Xia, Santa Clara, CA (US); Mei-Yee Shek Le, Mountain View, CA (US)

(73) Assignee: Applied Materials, Santa Clara, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 10/888,110

(22) Filed: Jul. 9, 2004

(65) Prior Publication Data

US 2005/0042889 A1 Feb. 24, 2005

Related U.S. Application Data

(63) Continuation-in-part of application No. 10/247,404, filed on Sep. 19, 2002, now Pat. No. 6,838,393, and a continuation-in-part of application No. 10/196,498, filed on Jul. 15, 2002, now Pat. No. 6,890,850.

(60) Provisional application No. 60/397,184, filed on Jul. 19, 2002, provisional application No. 60/340,615, filed on Dec. 14, 2001.

(51) Int. Cl.
*H01L 21/31* (2006.01)
(52) U.S. Cl. .................................... 438/778
(58) Field of Classification Search ............... None
See application file for complete search history.

(56) References Cited

U.S. PATENT DOCUMENTS

| | | | |
|---|---|---|---|
| 3,510,369 A | 5/1970 | Emick et al. |
| 4,262,631 A | 4/1981 | Kubacki |
| 4,532,150 A | 7/1985 | Endo et al. |
| 4,634,601 A | 1/1987 | Hamakawa et al. |
| 4,759,947 A | 7/1988 | Ishihara et al. |
| 4,894,352 A | 1/1990 | Lane et al. |
| 4,895,734 A | 1/1990 | Yoshida et al. |
| 4,951,601 A | 8/1990 | Maydan et al. |
| 5,003,178 A | 3/1991 | Livesay |
| 5,011,706 A | 4/1991 | Tarhay et al. |
| 5,086,014 A | 2/1992 | Miyata et al. |

(Continued)

FOREIGN PATENT DOCUMENTS

DE 41 26 759 2/1993

(Continued)

OTHER PUBLICATIONS

Omar, M.A., "Elementary Solid State Physics: Principles and Applications," Lowell Technological Institute, Addison-Wesley Publishing Company, © 1975, pp.: 124, 125.

(Continued)

*Primary Examiner*—Thao P. Le
(74) *Attorney, Agent, or Firm*—Patterson and Sheridan

(57) ABSTRACT

Methods and apparatus are provided for processing a substrate with a bilayer barrier layer. In one aspect, the invention provides a method for processing a substrate including depositing a nitrogen containing barrier layer on a substrate surface and then depositing a nitrogen free barrier layer thereon. The barrier layer may be deposited over dielectric materials, conductive materials, or both. The bilayer barrier layer may also be used as an etch stop, an anti-reflective coating, or a passivation layer.

52 Claims, 5 Drawing Sheets

U.S. PATENT DOCUMENTS

| | | | |
|---|---|---|---|
| 5,224,441 A | 7/1993 | Felts et al. | |
| 5,238,866 A | 8/1993 | Bolz et al. | |
| 5,242,530 A | 9/1993 | Batey et al. | |
| 5,298,597 A | 3/1994 | Yuo et al. | |
| 5,360,491 A | 11/1994 | Carey et al. | |
| 5,465,680 A | 11/1995 | Loboda | |
| 5,468,978 A | 11/1995 | Dowben | |
| 5,480,300 A | 1/1996 | Okoshi et al. | |
| 5,494,712 A | 2/1996 | Hu et al. | |
| 5,554,570 A | 9/1996 | Maeda et al. | |
| 5,565,084 A | 10/1996 | Lee et al. | |
| 5,591,566 A | 1/1997 | Ogawa | |
| 5,628,828 A | 5/1997 | Kawamura et al. | |
| 5,638,251 A | 6/1997 | Goel et al. | |
| 5,641,607 A | 6/1997 | Ogawa et al. | |
| 5,658,834 A | 8/1997 | Dowben | |
| 5,691,209 A | 11/1997 | Liberkowski | |
| 5,710,067 A | 1/1998 | Foote et al. | |
| 5,711,987 A | 1/1998 | Bearinger et al. | |
| 5,730,792 A | 3/1998 | Camilletti et al. | |
| 5,741,626 A | 4/1998 | Jain et al. | |
| 5,776,235 A | 7/1998 | Camilletti et al. | |
| 5,780,163 A | 7/1998 | Camilletti et al. | |
| 5,789,316 A | 8/1998 | Lu | |
| 5,789,776 A | 8/1998 | Lancaster et al. | |
| 5,817,579 A | 10/1998 | Ko et al. | |
| 5,818,071 A | 10/1998 | Loboda et al. | |
| 5,855,681 A | 1/1999 | Maydan et al. | |
| 5,869,396 A | 2/1999 | Pan et al. | |
| 5,876,891 A | 3/1999 | Takimoto et al. | |
| 5,926,740 A | 7/1999 | Forbes et al. | |
| 5,989,998 A | 11/1999 | Sugahara et al. | |
| 6,051,321 A | 4/2000 | Lee et al. | |
| 6,054,379 A | 4/2000 | Yau et al. | |
| 6,057,251 A | 5/2000 | Goo et al. | |
| 6,060,132 A | 5/2000 | Lee | |
| 6,068,884 A | 5/2000 | Rose et al. | |
| 6,071,809 A | 6/2000 | Zhao | |
| 6,072,227 A | 6/2000 | Yau et al. | |
| 6,080,526 A | 6/2000 | Yang et al. | |
| 6,107,192 A | 8/2000 | Subrahmanyan et al. | |
| 6,140,226 A | 10/2000 | Grill et al. | |
| 6,147,009 A | 11/2000 | Grill et al. | |
| 6,159,871 A | 12/2000 | Loboda et al. | |
| 6,169,039 B1 | 1/2001 | Lin et al. | |
| 6,242,339 B1 | 6/2001 | Aoi | |
| 6,242,530 B1 | 6/2001 | Konig et al. | |
| 6,287,990 B1 | 9/2001 | Cheung et al. | |
| 6,291,334 B1 | 9/2001 | Somekh | |
| 6,303,523 B1 | 10/2001 | Cheung et al. | |
| 6,312,793 B1 | 11/2001 | Grill et al. | |
| 6,316,167 B1 | 11/2001 | Angelopoulos et al. | |
| 6,340,435 B1 | 1/2002 | Bjorkman et al. | |
| 6,340,628 B1 | 1/2002 | Van Cleemput et al. | |
| 6,344,693 B1 | 2/2002 | Kawahara et al. | |
| 6,348,725 B1 | 2/2002 | Cheung et al. | |
| 6,352,945 B1 | 3/2002 | Matsuki et al. | |
| 6,365,527 B1 | 4/2002 | Yang et al. | |
| 6,383,955 B1 | 5/2002 | Matsuki et al. | |
| 6,399,489 B1 | 6/2002 | M'Saad et al. | |
| 6,410,462 B1 * | 6/2002 | Yang et al. | 438/788 |
| 6,410,463 B1 | 6/2002 | Matsuki | |
| 6,413,583 B1 | 7/2002 | Moghadam et al. | |
| 6,432,846 B1 | 8/2002 | Matsuki | |
| 6,436,824 B1 * | 8/2002 | Chooi et al. | 438/687 |
| 6,437,443 B1 | 8/2002 | Grill et al. | |
| 6,444,136 B1 | 9/2002 | Liu et al. | |
| 6,444,568 B1 | 9/2002 | Sundararajan et al. | |
| 6,455,445 B1 | 9/2002 | Matsuki | |
| 6,465,366 B1 | 10/2002 | Nemani et al. | |
| 6,479,110 B1 | 11/2002 | Grill et al. | |
| 6,500,773 B1 | 12/2002 | Gaillard et al. | |
| 6,511,903 B1 | 1/2003 | Yau et al. | |
| 6,511,909 B1 | 1/2003 | Yau et al. | |
| 6,532,150 B1 | 3/2003 | Sivertsen et al. | |
| 6,537,929 B1 | 3/2003 | Cheung et al. | |
| 6,541,282 B1 | 4/2003 | Cheung et al. | |
| 6,548,690 B1 | 4/2003 | Mimoun | |
| 6,548,899 B1 | 4/2003 | Ross | |
| 6,555,476 B1 | 4/2003 | Olsen et al. | |
| 6,562,690 B1 | 5/2003 | Cheung et al. | |
| 6,573,193 B1 | 6/2003 | Yu et al. | |
| 6,573,196 B1 | 6/2003 | Gaillard et al. | |
| 6,582,777 B1 | 6/2003 | Ross et al. | |
| 6,583,048 B1 | 6/2003 | Vincent et al. | |
| 6,592,890 B1 | 7/2003 | Green | |
| 6,593,247 B1 | 7/2003 | Huang et al. | |
| 6,593,633 B1 | 7/2003 | Jan et al. | |
| 6,593,653 B1 | 7/2003 | Sundararajan et al. | |
| 6,593,655 B1 | 7/2003 | Loboda et al. | |
| 6,596,655 B1 | 7/2003 | Cheung et al. | |
| 6,624,053 B1 | 9/2003 | Passemard | |
| 6,627,532 B1 | 9/2003 | Gaillard et al. | |
| 6,649,531 B1 | 11/2003 | Cote et al. | |
| 6,660,656 B1 | 12/2003 | Cheung et al. | |
| 6,660,663 B1 | 12/2003 | Cheung et al. | |
| 6,730,593 B1 | 5/2004 | Yau et al. | |
| 6,734,115 B1 | 5/2004 | Cheung et al. | |
| 2002/0000670 A1 | 1/2002 | Yau et al. | |
| 2002/0045361 A1 | 4/2002 | Cheung et al. | |
| 2002/0093075 A1 | 7/2002 | Gates et al. | |
| 2002/0111042 A1 | 8/2002 | Yau et al. | |
| 2002/0155385 A1 | 10/2002 | Xu et al. | |
| 2002/0160626 A1 | 10/2002 | Matsuki et al. | |
| 2002/0172766 A1 | 11/2002 | Laxman et al. | |
| 2003/0001282 A1 | 1/2003 | Meynen et al. | |
| 2003/0003765 A1 | 1/2003 | Gibson Jr., et al. | |
| 2003/0003768 A1 | 1/2003 | Cho et al. | |
| 2003/0040195 A1 | 2/2003 | Chang et al. | |
| 2003/0042605 A1 | 3/2003 | Andideh et al. | |
| 2003/0064154 A1 | 4/2003 | Laxman et al. | |
| 2003/0068881 A1 | 4/2003 | Xia et al. | |
| 2003/0089988 A1 | 5/2003 | Matsurra | |
| 2003/0111730 A1 | 6/2003 | Takeda et al. | |
| 2003/0129827 A1 | 7/2003 | Lee et al. | |
| 2003/0139035 A1 | 7/2003 | Yim et al. | |
| 2003/0194496 A1 | 10/2003 | Xu et al. | |

FOREIGN PATENT DOCUMENTS

| | | |
|---|---|---|
| DE | 196 54 737 | 12/1996 |
| DE | 199 04 311 | 8/1999 |
| EP | 0 613 178 | 2/1994 |
| EP | 0 725 440 | 8/1996 |
| EP | 0 935 283 | 8/1999 |
| EP | 1 029 728 | 8/2000 |
| EP | 1 107 303 | 6/2001 |
| EP | 1 122 770 | 8/2001 |
| EP | 1 176 226 | 1/2002 |
| JP | 09-008031 | 1/1997 |
| JP | 09 320 075 | 12/1997 |
| WO | WO 99/33102 | 7/1999 |
| WO | WO 99/41423 | 8/1999 |
| WO | WO 00/19498 | 4/2000 |
| WO | WO 00/19508 | 4/2000 |
| WO | WO 00/20900 A2 | 4/2000 |
| WO | WO 00/20900 A3 | 4/2000 |

OTHER PUBLICATIONS

Fukuda, et al. "Highly Reliable SiOF Film Formation by ECR-CVD Using $SiF_2H_2$", Symposium on VLSI Technology Digest of Technical Papers IEEE (1996) pp. 114-115.

PCT International Search Report for PCT/US2004/000374, dated Jun. 18, 2004 (AMAT/7653.PCT).

V. Cech, et al. "Thin Plasma-Polymerized Films of Dichloro(Methyl)Phenylsilane" Czechoslovak Journal of Physics, vol. 50 (2000), Suppl. S3 pp. 356-364.

PCT Partial International Search Report dated Mar. 21, 2000, for US99/22317. (AMAT/2966.02.PCT).

Written Opinion, for US99/22424, dated Apr. 5, 2001. (AMAT/2966.03.PCT).

PCT International Search Report for US02/40034 dated May 19, 2003. (AMAt/6084.PCT).

PCT International Report for US99/22425 dated Feb. 11, 2000. (AMAT/2966.PCT).

PCT International Search Report for US02/36229 dated Sep. 3, 2003. (AMAT/36229.PCT).

Ogawa et al., "Novel ARC Optimization Methodology for KrF Excimer Laser Lithography at Low K1 Factor". Proceedings of the SPIE. Optical/Laser Microlithography V, vol. 1674, 1992, pp. 362-375.

Dijkstra et al., "Optimization of Anti-Reflection Layers for Deep UV Lithography", Proceedings of SPIE Optical/Laser Microlithography, Bellingham, SPIE, vol. 1927, 1993 pp. 275-286.

Wu, et al., "Advanced Metal Barrier Free Cu Damascene Interconnects with PECVD Silicon Carbide Barriers for 90/65-nm BEOL Technology", 2002 IEEE, IEDM pp. 595-598.

Written Opinion, for US04/000374, dated Jan. 1, 2004.

U.S. Appl. No. 09/270,039, filed Mar. 16, 1999, Huang. (AMAT/2966.X3).

* cited by examiner

BI-LAYER APPROACH FOR A HERMETIC LOW DIELECTRIC CONSTANT LAYER FOR BARRIER APPLICATIONS

CROSS-REFERENCE TO RELATED APPLICATIONS

This application is a continuation-in-part of U.S. patent application Ser. No. 10/247,404, filed Sep. 19, 2002, now U.S. Pat. No. 6,838,393 which patent application claims benefit of U.S. Provisional Patent Application Ser. No. 60/397,184, filed Jul. 19, 2002, and is a continuation-in-part of U.S. patent application Ser. No. 10/196,498, filed Jul. 15, 2002, now U.S. Pat. No. 6,890,850 which patent application claims benefit of U.S. Provisional Patent Application Ser. No. 60/340,615, filed Dec. 14, 2001.

BACKGROUND OF THE DISCLOSURE

1. Field of the Invention
2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 μm and even 0.18 μm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to also reduce the capacitive coupling between adjacent metal lines. One such low k material is silicon oxycarbide deposited by a chemical vapor deposition process and silicon carbide, both of which may be used as dielectric materials in fabricating damascene features.

One conductive material having a low resistivity is copper and its alloys, which have become the materials of choice for sub-quarter-micron interconnect technology because copper has a lower resistivity than aluminum, (1.7 μΩ-cm for copper compared to 3.1 μΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve-a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, e.g., vias, and horizontal interconnects, e.g., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, low k dielectric materials are often porous and susceptible to interlayer diffusion of conductive materials, such as copper, which can result in the formation of short-circuits and device failure. A dielectric barrier layer material is often disposed between the copper material and surrounding the low k material to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Further when silicon oxycarbide layers or silicon carbide layers are used as the low k material in damascene formation, it has been difficult to produced aligned features with little or no defects. It as been observed that resist materials deposited on the silicon oxycarbide layers or the silicon carbide layers may be contaminated with nitrogen deposited with those layers or nitrogen that diffuses through those layers. For example, reaction of organosilicon compounds with nitrous oxide can contaminate the silicon oxycarbide layer with nitrogen or the nitrogen in nitrogen-doped silicon carbide layers may diffuse through adjacent layers as amine radicals ($-NH_2$) to react with the resist materials.

Resist materials contaminated with nitrogen becomes less sensitive to radiation. The decrease in the sensitivity to radiation is, referred to as "resist poisoning". Any resist material that is not sensitive to radiation is not removed by subsequent resist stripping processes and remains as residue. The remaining residue of resist material is referred to as "footing". This residue can result in detrimentally affecting subsequent etching processes and result in misaligned and malformed features.

Further, the conventional nitrogen free barrier layers have exhibited less than desirable interlayer adhesion to conductive materials as well as other dielectric materials. Additionally, conventional barrier layer materials have shown a loss of hermeticity, or atmosphere or moisture resistance, in the deposited layers, and allow moisture diffusion through layers during processing at high temperature when moisture may evolve from the deposited materials. Moisture in the deposited layer may detrimentally affect layer deposition and be a source of oxidation of deposited metals, and can even result in device failure.

Therefore, there remains a need for an improved process for depositing dielectric material and resist materials for layering techniques, such as damascene applications, with reduced resist poisoning, improved adhesion, and improved hermeticity.

SUMMARY OF THE INVENTION

Aspects of the invention generally provide a method for depositing and treating a dielectric material having a low dielectric constant as a barrier layer, a n etch stop layer, or an anti-reflective coating. In one aspect, the invention provides a method for processing a substrate including providing substrate having conductive features formed in a dielectric material to a processing chamber, depositing a first barrier layer comprising silicon, carbon, and nitrogen on the substrate, depositing a second barrier layer on the first barrier layer, wherein the second barrier layer is a nitrogen free dielectric layer comprising silicon and carbon and deposited by reacting a processing gas comprising hydrogen and an oxygen-free organosilicon compound having the formula $SiH_a(CH_3)_b(C_6H_5)_c$, wherein a is 0 to 3, b is 0 to 3, and c is 1 to 4.

In another aspect, a method is provided for processing a substrate including providing substrate having conductive features formed in a dielectric material to a processing chamber, depositing a first barrier layer comprising silicon, carbon, and nitrogen on the substrate, depositing a second barrier layer on the first barrier layer, wherein the second barrier layer is a nitrogen free dielectric layer comprising silicon and carbon and deposited by reacting a processing gas comprising a carbon and oxygen containing compound and an oxygen-free organosilicon compound and has an oxygen content of less than about 15 atomic percent.

In another aspect, a method is provided for processing a substrate including positioning the substrate in a processing chamber, wherein the substrate comprises one or more patterned low k dielectric layers and a conductive material formed therein, initiating a plasma of a reducing compound comprising nitrogen and hydrogen in the processing chamber, introducing an organosilicon compound in the processing chamber, reacting the organosilicon compound with the reducing compound, depositing a nitrogen doped silicon carbide barrier layer on the one or more patterned low k dielectric layers and conductive material, and depositing a nitrogen free silicon carbide barrier layer on the nitrogen doped silicon carbide layer without breaking vacuum.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
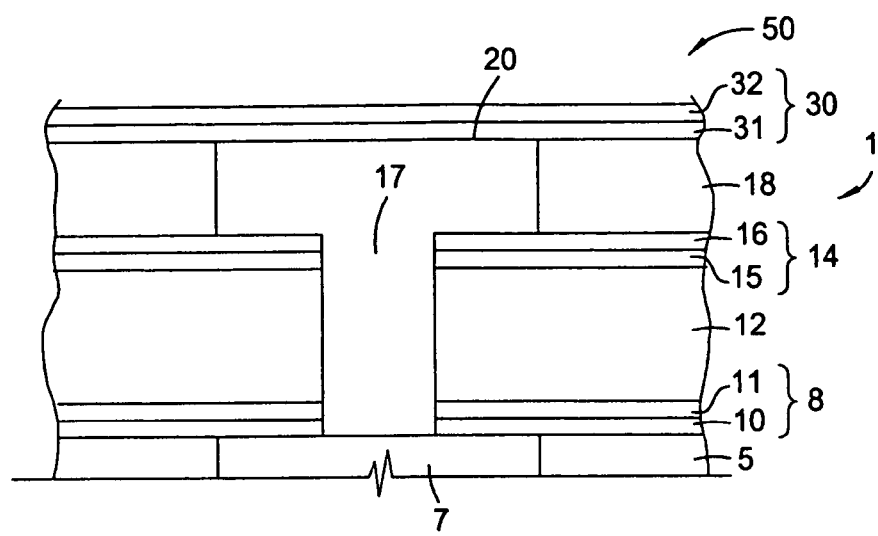
FIG. 1 is a cross sectional view showing a dual damascene structure comprising a low k barrier layer and a low k dielectric layer described herein.

For a further understanding of aspect of the invention, reference should be made to the ensuing detailed description.

DETAILED DESCRIPTION OF THE PREFERRED EMBODIMENTS

The words and phrases used herein should be given their ordinary and customary meaning in the art by one skilled in the art unless otherwise further defined. In situ should be broadly construed and includes, but is not limited to, in a given chamber, such as in a plasma chamber, or in a system, such as an integrated cluster tool arrangement, without exposing the material to intervening contamination environments, such as breaking vacuum between process steps or chamber within a tool. An in situ process typically minimizes process time and possible contaminants compared to relocating the substrate to other processing chambers or areas.

Aspects of the invention described herein refer to a method and apparatus for depositing a bilayer of silicon carbide containing materials having a low dielectric constant. The silicon carbide barrier layers include nitrogen doped silicon carbide, oxygen-doped silicon carbide, and silicon carbide deposited from aryl containing organosilicon compounds. The deposited layers may be treated with an anneal process, a plasma treatment process, an e-beam treatment, or an ultraviolet treatment. The bilayer preferably includes a nitrogen containing silicon carbide material with a nitrogen containing silicon carbide material disposed thereon. The bilayer is believe to provide good interlayer adhesion, improved barrier properties for metals, improved hermeticity, reduced resist poisoning, and in situ deposition. The bilayer may be used as a barrier layer, an etch stop, an anti-reflective coating, (ARC), and/or a passivation layer following planarization.

The following deposition processes are described with use of the 300 mm Produce™ dual deposition station processing chamber, and should be interpreted accordingly, for example, flow rates are total flow rates and should be divided by two to describe the process flow rates at each deposition station in the chamber. Additionally, it should be noted that the respective parameters may be modified to perform the plasma processes in various chambers and for different substrate sizes, such as for 200 mm substrates.

Deposition of Dual Layers for a Dual Damascene Structure

The bilayer barrier layer described herein may be used as barrier layers, etch stops, and anti-reflective coating/passivation layers in damascene formation, of which use as a barrier layer is preferred. Interlayer dielectric layers for use in low k damascene formations may have a silicon carbide layer formed as described herein include dielectric layers having silicon, oxygen, and carbon, and a dielectric constant of less than about 3. The adjacent dielectric layers for use with the barrier layer material described herein have a carbon content of about 1 atomic percent or greater excluding hydrogen atoms, preferably between about 5 and about 30 atomic percent excluding hydrogen atoms, and have oxygen concentrations of about 15 atomic % or greater. Oxygen-doped silicon carbide layers have oxygen concentrations of less than about 15 atomic % oxygen. Barrier layer materials may have dielectric constants of up to about 9, and preferably between about 2.5 and less than about 4. Silicon carbide barrier layers may have dielectric constants of about 5 or less, preferably less than about 4.

The embodiments described herein for depositing silicon carbide layers adjacent low k dielectric layers are provided to illustrate the invention and the particular embodiment shown should not be used to limit the scope of the invention.

An example of a damascene structure that is formed using the bilayer described herein as a barrier layer is shown in FIG. 1. A damascene structure is formed using a substrate 1 having conductive material features 7 such as copper features, formed in a substrate material 5 is provided to a processing chamber. A bilayer barrier layer 8 is deposited on, the substrate 1. The first barrier layer 10 of the bilayer barrier layer 8 may comprise nitrogen doped silicon carbide is generally deposited on the substrate surface to eliminate inter-level diffusion and/or improve adhesion between the substrate and subsequently deposited material. The first silicon carbide barrier layer 10 may be post deposition treated as described herein. A second barrier layer 11 of the bilayer barrier layer 108 may comprise nitrogen-free silicon carbide and is deposited on the first barrier layer 10.

The bilayer barrier layer 8 is believed to provide improved barrier properties over single layer barrier layers. The bilayer barrier layer 8 provides a hermetic first barrier layer 10, such as silicon carbonitride, and a second barrier layer 11, such as silicon carbide or oxygen doped silicon carbide, that may be less hermetic than the first barrier layer 10. The second barrier layer 11 may have a dielectric constant-less than the first barrier layer 10, and the second barrier layer 11 may also have a greater etch selectivity to underlying dielectric material than the first barrier layer 10. It is believed that the bilayer provides better hermeticity, lower dielectric constants, improved etch selectivity, and reduced photoresist poisoning as compared to single layer barrier layers.

A first dielectric layer 12 is deposited on the bilayer barrier layer 8. An etch stop (or second barrier layer) 14 is then deposited on the first dielectric layer 12. The etch stop 14 may comprise a bilayer etch stop, for example, of a nitrogen doped silicon carbide layer 15 and an oxygen doped or undoped silicon carbide layer 16 disposed thereon. The etch stop is then pattern etched using conventional techniques to define the openings-of the interconnects or contacts/vias.

A second dielectric layer 18 is then deposited over the patterned etch stop 14. A resist is then deposited and patterned by conventional means known in the art to define the contacts/via 16. A resist material may include an energy based resist material including deep ultraviolet (DUV) resist materials as well as e-beam resist materials. While not shown, an ARC layer and/or a cap layer, for example, of silicon oxide or silicon carbide may be deposited prior to depositing the resist layer.

A single etch process is then performed to define the contact/interconnect feature definition 17 down to the etch stop 14 and to etch the unprotected dielectric 12 and bilayer barrier layers 8 exposed by the patterned etch stop 14 to define the contacts/vias 17. One or more conductive materials 20 such as copper are then deposited to fill the contacts/interconnect feature definitions 117. A bilayer 30 of silicon carbide materials as described herein including for example, nitrogen doped silicon carbide layer 31 and nitrogen free silicon carbide layer 32 may be deposited on the second dielectric layer 18 and conductive materials 20. The bilayer 30 may perform as a passivation layer or as a barrier layer for another level of damascene structures formed as described herein.

A preferred dual damascene structure fabricated in accordance with the invention including bilayers deposited by the processes described herein is sequentially depicted schematically in FIGS. 2A–2H, which are cross sectional views of a substrate having the steps of the invention formed thereon.

An example of a damascene structure that is formed using the bilayer described herein as a barrier layer is shown in FIG. 1. A damascene structure is formed using a substrate 100 having conductive material features 107 formed in a substrate material 105, such as a dielectric material, silicon, or non-metal conductive material, such as polysilicon or doped silicon, is provided to a processing chamber. The conductive materials are typically metal, including metal barrier materials, such as titanium, titanium nitride, tantalum, tantalum nitride, or combinations thereof, and fill materials, such as copper aluminum, or tungsten for example.

Figure 2A:
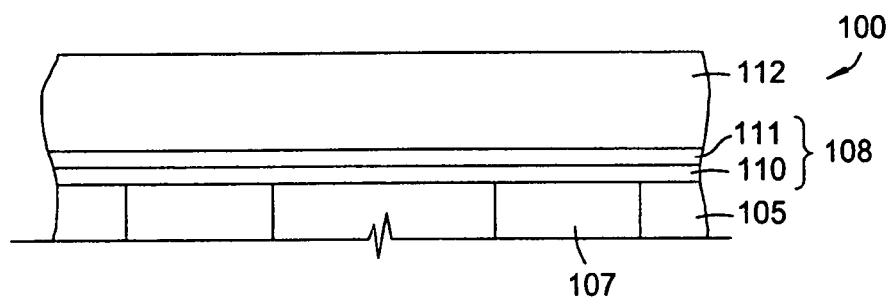
FIGS. 2A–2H are cross sectional views showing one embodiment of a dual damascene deposition sequence of the invention.

As shown in FIG. 2A, a barrier bilayer 108 is deposited on the substrate 100. The barrier bilayer 108 may be deposited to a thickness between about 50 Å and about 500 Å. The barrier bilayer 108 may comprise a first barrier layer 110 of nitrogen doped silicon carbide and is deposited on the substrate surface from the processes described herein. The nitrogen doped silicon carbide material may be deposited by introducing ammonia at a flow rate of 700 sccm into the processing chamber, introducing helium at a flow rate of 1200 sccm into the processing chamber, introducing trimethylsilane (TMS) at a flow rate of about 350 sccm, maintaining the chamber at a heater temperature of about 350° C., maintaining a chamber pressure of about 3.7 Torr, positioning a gas distributor at about 280 mils from the substrate surface, and applying a RF power of about 900 watts at 13.56 MHz, to deposit a silicon carbide layer. The silicon carbide material is deposited at about 1800 Å/min by this process to a thickness of about 1000 Å. The deposited nitrogen doped silicon carbide layer has a dielectric constant of about 5.

While not shown, a plasma pretreatment process of the substrate 1 may be performed prior to deposition of the nitrogen doped silicon carbide. The nitrogen doped silicon carbide barrier layer 110 may then be treated to one of the post-treatment processes described herein including anneal, plasma treatment, e-beam treatment, or an ultraviolet curing treatment as described herein. The pre-treatment, the nitrogen doped silicon carbide material, and any post-treatment process may be formed in the same processing chamber or same processing system without breaking vacuum.

A second barrier layer 111, which may be a nitrogen free silicon carbide materials, is deposited on the first barrier layer 110. The nitrogen free silicon carbide material may be deposited as an oxygen-doped silicon carbide layer as described herein and/or as a silicon carbide layer deposited from phenylsilanes as described herein. Alternatively, or additionally, a capping layer (not shown), for example, of silicon oxide, may be deposited on the barrier layer 111. The second barrier layer 111 may be deposited to a thickness between about 100 Å and about 1000 Å.

An example of a oxygen-doped silicon carbide deposition comprises introducing carbon dioxide at a flow rate of 700 sccm into the processing chamber, introducing helium at a flow rate of 400 sccm into the processing chamber, introducing trimethylsilane (TMS) at a flow rate of about 160 sccm, maintaining the chamber at a heater temperature of about 350° C., maintaining a chamber pressure of about 2.5 Torr, positioning a gas distributor at about 320 mils from the substrate surface, and applying a RF power of about 200 watts at 13.56 MHz, to deposit a silicon carbide layer. The oxygen-doped silicon carbide material is deposited at about 900 Å/min by this process to a thickness of about 500 Å. The deposited silicon carbide layer has a dielectric constant of about 3.5 to about 4.6.

An example of a phenylsilane based silicon carbide deposition process comprises introducing hydrogen at a flow rate of 500 sccm into the processing chamber, introducing helium at a flow rate of 1500 sccm into the processing chamber, introducing dimethylphenylsilane (DMPS) at a flow rate of about 750 sccm, maintaining the chamber at a heater temperature of about 350° C., maintaining a chamber pressure of about 6 Torr, positioning a gas distributor at about 450 mils from the substrate surface, and applying a RF power of about 200 watts at 13.56 MHz, to deposit a silicon carbide layer. The silicon carbide material is deposited at about 1250 Å/min by this process to a thickness of about 500 Å. The deposited silicon carbide layer has a dielectric constant of about 3 to about 4.

While not shown, the nitrogen free silicon carbide barrier layer 111 may then be treated to one of the post-treatment processes described herein including anneal, plasma treatment, e-beam treatment, or an ultraviolet curing treatment as described herein. The nitrogen free silicon carbide material and any post-treatment process may be formed in the same processing chamber or same processing system without breaking vacuum. The bilayer 108 may have both first and second barrier layers 110, 111, respectively, deposited in the same chamber or same processing system without breaking vacuum.

The first dielectric layer 112 of interlayer dielectric material is deposited on the bilayer barrier 108. The first dielectric layer 112 may comprise silicon, oxygen, and carbon, and be deposited by oxidizing an organosilane or organosiloxane, such as trimethylsilane. Examples of methods and uses for the adjacent dielectric layers comprising silicon, oxygen, and carbon, having a dielectric constant of less than about 3 are more further described in U.S. Pat. No. 6,054,379, issued May 25, 2000, U.S. Pat. No. 6,287,990, issued Sep. 11, 2001, and U.S. Pat. No. 6,303,523, issued on Oct. 16, 2001, and in U.S. patent application Ser. No. 10/121,284, filed on Apr. 11, 2002, and U.S. patent application Ser. No. 10/302,393, filed on Nov. 22, 2002, all of which are incorporated by reference herein to the extent not inconsistent with the disclosure and claimed aspects described herein.

An example of a dielectric layer comprising silicon, oxygen, and carbon, having a dielectric constant of less than about 3 is Black Diamond™ dielectric materials commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). The first dielectric layer 112 may be deposited to a thickness of about 5,000 Å to about 15,000 Å, depending on the size of the structure to be fabricated.

Figure 2B:
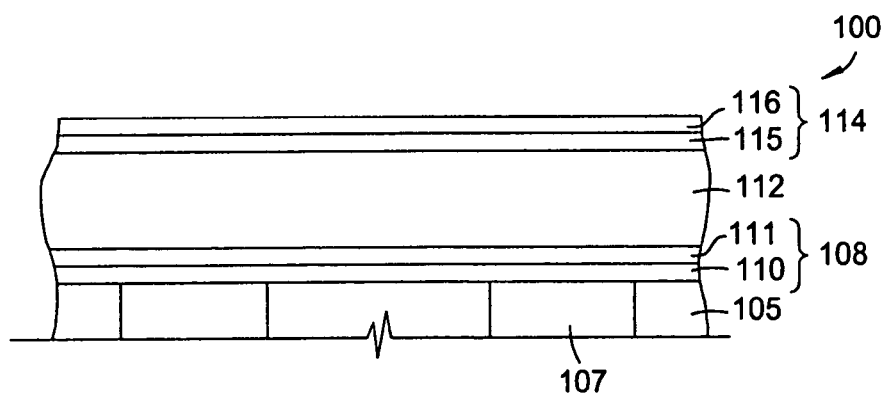

As shown in FIG. 2B, a low k etch stop 114 is then deposited on the first dielectric layer 112. The etch stop may be deposited to a thickness between about 200 Å and about 1000 Å. The etch stop 114 may comprise a first etch stop layer 115 of nitrogen doped silicon carbide, which may be deposited from the same precursors and by the same process as the nitrogen doped silicon carbide barrier layer 110, and a second etch stop layer 116 of nitrogen free silicon carbide, which may be deposited from the same precursors and by the same process as the nitrogen free silicon carbide barrier layer 108. The low k etch stop 114 and respective layers 115, 116 may be treated as described herein for the silicon carbide barrier layers 110, 111.

Figure 2C:
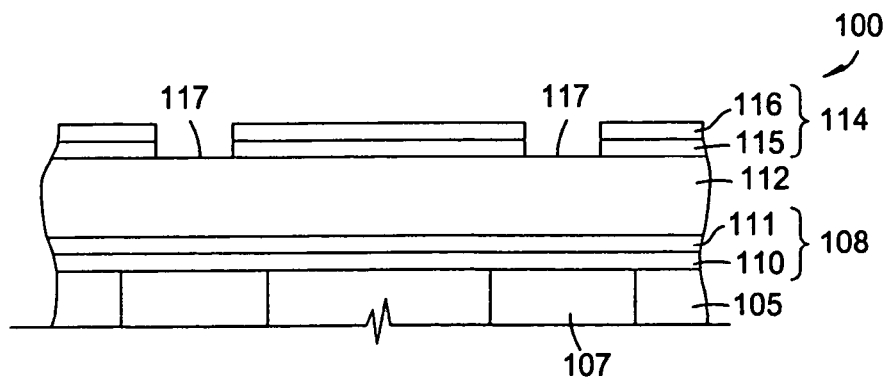

The low k etch stop may then pattern etched to define the contact/via feature definition openings 117 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 114 prior to depositing further materials.

Figure 2D:
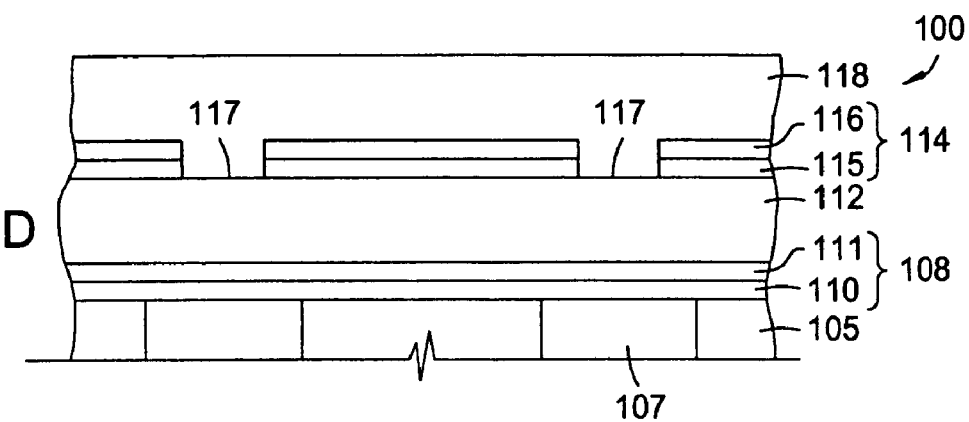

After the low k etch stop 114 has been etched to pattern the contacts/vias and the resist has been removed, a second dielectric layer 118 of silicon oxycarbide is deposited. The second dielectric layer may be deposited to a thickness between about 5,000 and about 15,000 Å as shown in FIG. 2D. The second dielectric layer 118 may be deposited as described for the first dielectric layer 112 as well as comprise the same materials used for the first dielectric layer 112. The first and second dielectric layer 118 may also be treated as described herein for barrier layer 110. All of the described layers 108, 110, 111, 112, 114, 115, 116, and 118 may be deposited in the same processing chamber or same processing system without breaking vacuum.

In an alternative embodiment, an anti-reflective coating layer, a cap layer, or a hardmask layer, may be deposited on the second dielectric layer 118 prior to depositing additional materials, such as resist materials for photolithographic process. Such a layer may be deposited between about 100 Å and about 500 Å thick. In one example, an ARC layer or hardmask of the bilayer described herein may be disposed on the second dielectric layer 118, and then a photoresist may be deposited thereon. In a further embodiment, a nitrogen-free silicon carbide layer as described herein or a silicon oxide cap layer may be deposited on second dielectric layer 118.

Figure 2E:
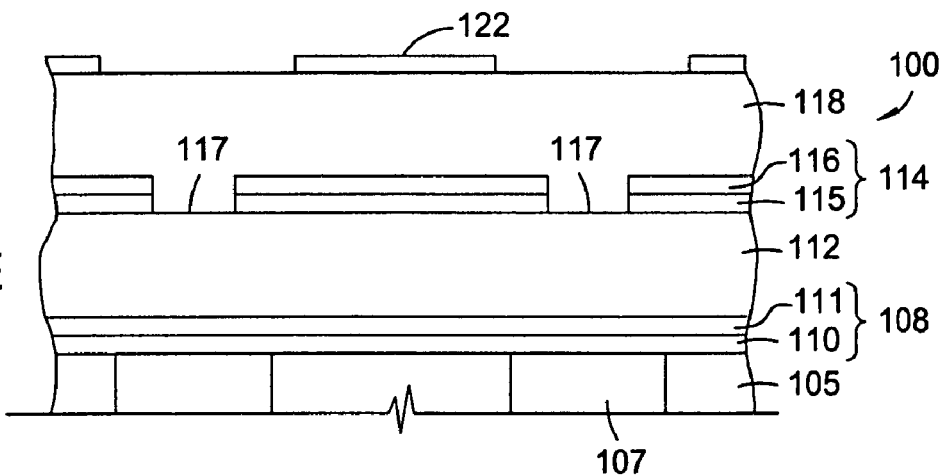
Figure 2F:
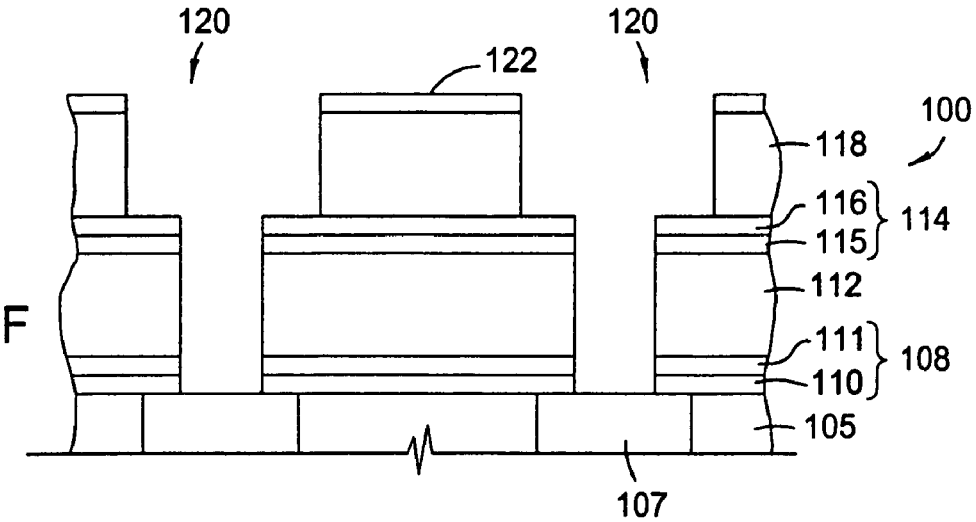

A resist material 122 is then deposited on the second dielectric layer 118 (or optional ARC layer or passivation layer as described with regard to FIG. 1) and patterned preferably using conventional photolithography processes to define the interconnect lines 120 as shown in FIG. 2E. The resist material 122 comprises a, material conventionally known in the art, preferably a high activation energy resist, such as UV-5, commercially available from Shipley Company, Inc., of Marlborough, Mass. The interconnects and contacts/vias are then etched using reactive ion etching or other anisotropic etching techniques to define the metallization structure (i.e., the interconnect and contact/via) as shown in FIG. 2F. Any resist or other material used to pattern the etch stop 114 or the second dielectric layer 118 is removed using an oxygen strip or other suitable process.

Figure 2G:
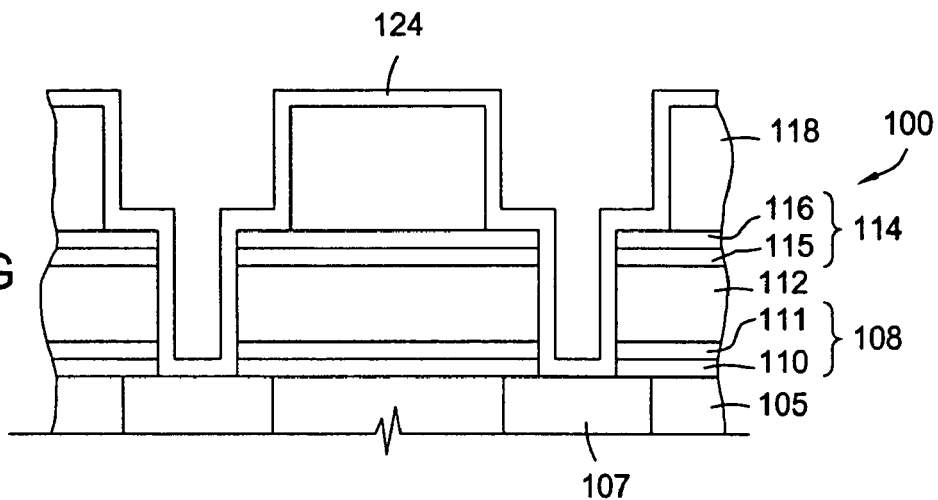
Figure 2H:
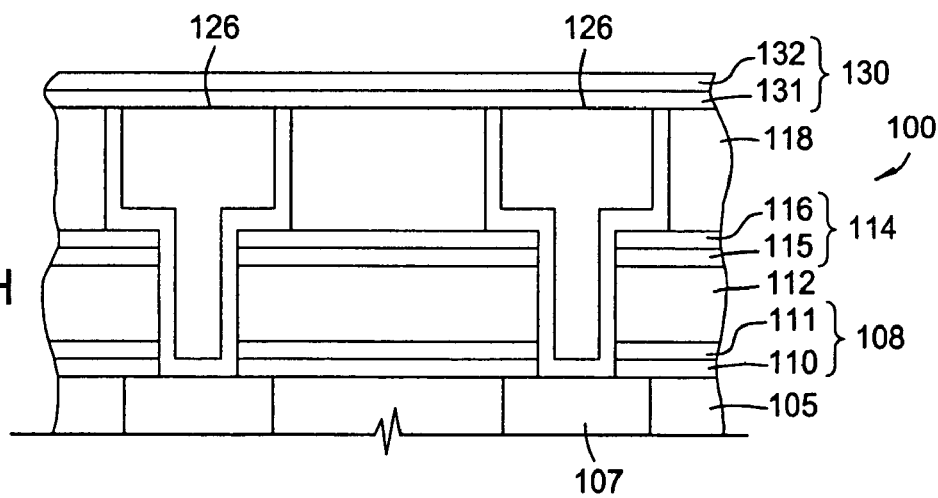

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable barrier layer 124 for copper, such as tantalum or tantalum nitride, is first deposited conformally in the metallization pattern to prevent copper migration into the surrounding silicon and/or dielectric material. Thereafter, copper 126 is deposited using chemical vapor deposition, physical vapor deposition, electroplating, or combinations thereof to form the conductive structure. A seed layer of a conductive material, such as copper, may be deposited for bulk fill of the feature definition by the copper 126. Once the structure has been filled with copper or other metal, the surface is planarized using chemical mechanical polishing, as shown in FIG. 2H.

Following planarization of the conductive materials 124, 126, a passivation bilayer 130 may be deposited on the substrate. The passivation bilayer 130 may also perform as a barrier layer for another level of damascene structures that may be formed thereon. The passivation bilayer 130 may be deposited to a thickness between about 250 Å and about 1000 Å. The passivation bilayer 130 may comprise a first passivation layer 131 of nitrogen doped silicon carbide and is deposited and treated on the substrate surface from the processes described herein as described for the first barrier layer 110. The nitrogen doped silicon carbide material is deposited to a thickness between about 50 Å and about 100 Å. The second passivation layer 132, which may be a nitrogen free silicon carbide materials, is deposited (and treated) on the first passivation layer 110 from the processes described herein as described for the second barrier layer 111. The nitrogen free silicon carbide material may be deposited as an oxygen-doped silicon carbide layer as described herein and/or as a silicon carbide layer deposited from phenylsilanes as described herein. The second passivation layer 132 may be deposited to a thickness between about 100 Å and about 1000 Å.

Pre-Deposition Treatments

Interlayer adhesion between conductive features and deposited dielectric materials, such as copper 126 and the passivation bilayer 130, may be improved by exposing conductive features to a reducing compound of a hydrogen and nitrogen containing precursor to remove any oxides formed on the conductive materials. Oxides to be removed may also be formed on barrier materials, such as exposed portions of barrier layer 124. The reducing compound may react with the exposed conductive material by thermally and/or plasma enhanced process. Preferred reducing compounds include hydrogen and nitrogen containing gases, for example, ammonia, a gas mixture of hydrogen ($H_2$) and nitrogen ($N_2$), hydrazine ($N_2H_2$), amines, amine derivatives, or combinations thereof.

One example of a plasma enhanced process with the reducing compound includes providing reducing compounds to a processing chamber at a flow rate between about 50 sccm and about 2000 sccm, for example, between about 100 sccm and about 1600 sccm, optionally providing a nitrogen-containing carrier gas, such as nitrogen, to a processing chamber at a flow rate between about 100 sccm and about 25000 sccm, for example, between about 1000 sccm and about 20000 sccm, maintaining a chamber pressure between about 1 Torr and about 12 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 300 mils and 500 mils, from the substrate surface, and generating a plasma. The plasma treatment may be performed between about 3 seconds and about 120 seconds, for example, between about 5 seconds and about 40 seconds preferably used.

The plasma may be generated by applying a power density ranging between about 0.03 W/cm$^2$ and about 3.2 W/cm$^2$, which is a RF power level of between about 10 W and about 1000 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm$^2$ and about 1.4 W/cm$^2$, which is a RF power level of between about 10 W and about 1000 W for a 300 mm substrate, for example, between about 100 W and about 400 W at a high frequency such as between 13 MHz and 14 MHz, for example, 13.56 MHz. Alternatively, the plasma may be generated by a dual-frequency RF power source as described herein. Alternatively, all plasma generation may be performed remotely, with the generated radicals introduced into the processing chamber for plasma treatment of a deposited material or deposition of a material layer.

The reducing compound may comprise providing a single component, such as ammonia or hydrazine, to a processing chamber at a flow rate between about 50 sccm and about 3000 sccm, for example, between about 100 sccm and about 2000 sccm. The single component delivery may further include a carrier or inert gas, for example nitrogen, helium, or argon, at a flow rate of between about 100 sccm and about 10000 sccm, for example, between about 1000 sccm and about 5000 sccm. In a multi-component system, such as a mixture of nitrogen gas and hydrogen gas, may be provided to the processing chamber by a process including providing nitrogen to a processing chamber at a flow rate between about 50 sccm and about 5000 sccm, for example, between about 100 sccm and about 1000 sccm, and providing hydrogen to a processing chamber at a flow rate between about 50 sccm and about 5000 sccm, for example, between about 100 sccm and about 1500 sccm.

An example of the plasma treatment process includes providing ammonia to a processing chamber at a flow rate of about 700 sccm, providing helium to a processing chamber at a flow rate of about 1200 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

Another example of the plasma treatment process includes providing ammonia to a processing chamber at a flow rate of about 160 sccm, providing nitrogen to a processing chamber at a flow rate of about 18000 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

Another example of the plasma treatment process includes providing ammonia to a processing chamber at a flow rate of about 75 sccm, providing nitrogen to a processing chamber at a flow rate of about 5000 sccm, maintaining a chamber pressure at about 4.2 Torr, maintaining a heater temperature of about 350° C., positioning a gas distributor, or "showerhead", at about 350 mils, and generating a plasma by applying a RF power level of about 150 W at a high frequency of 13.56 MHz, for about 15 seconds.

The reducing compound may be continuously provided from the pre-treatment process to the deposition processes. For example, the nitrogen doped silicon carbide layer, such as barrier layer 110, may be deposited by introducing an organosilicon compound with the reducing agent provided to the chamber. This allows for in situ pre-treatment and layer deposition in the processing chamber. The organosilicon compound may be additionally and/or continuously introduced into the processing chamber with an ending of the flow of the of the reducing agent to deposit a silicon carbide layer as described for second barrier layer 111. Such an in situ pre-treatment and deposition process is more fully described in U.S. patent application Ser. No. 10/828,023 entitled, "Adhesion Improvement For Low K Dielectrics To Conductive Materials," filed on Apr. 19, 2004, which is incorporated by reference to the extent not inconsistent with the claimed aspects and disclosure herein.

Silicon Carbide Deposition

Silicon carbide layer may be deposited by reacting a processing gas of an organosilicon compound. Nitrogen-doped silicon carbide layers may be deposited by reacting a processing gas of the organosilicon compound and a nitrogen containing compound. Oxygen-doped silicon carbide layers may be deposited by reacting a processing gas of the organosilicon compound and a nitrogen containing compound. Phenyl silicon carbide layers may be deposited by reacting a processing gas of a phenyl containing organosilicon compound, and that may also be deposited with oxygen or nitrogen containing compounds. The processing gas may include additional compounds, such as hydrogen gas and/or an inert gas, including helium, argon, nitrogen, or combinations thereof.

Suitable organosilicon compounds for depositing silicon carbide materials include oxygen-free organosilicon compounds. Examples of oxygen free organosilicon compounds include phenylsilanes and aliphatic organosilicon compounds. Examples of suitable organosilicon compounds used herein for silicon carbide deposition preferably include the structure:

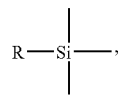

wherein R is an organic functional group, such as alkyl, alkenyl, cycloalkyl, such as cycloalkenyl, and aryl groups, in addition to functional derivatives thereof. The organic compounds may have more than one R group attached to the silicon atom, and the invention contemplates the use of organosilicon compounds with or without Si—H bonds.

Suitable oxygen-free organosilicon compounds include oxygen-free aliphatic organosilicon compounds, oxygen-free cyclic organosilicon compounds, or combinations thereof, having at least one silicon-carbon bond. Cyclic organosilicon compounds typically have a ring comprising three or more silicon atoms. Aliphatic organosilicon compounds have linear or branched structures comprising one or more silicon atoms and one or more carbon atoms. Commercially available aliphatic organosilicon compounds include alkylsilanes. Fluorinated derivatives of the organosilicon compounds described herein may also be used to deposit the silicon carbide and silicon oxycarbide layers described herein. Methylsilanes are preferred organosilicon compounds for silicon carbide deposition.

Examples of suitable organosilicon compounds include, for example, one or more of the following compounds:

| | |
|---|---|
| Methylsilane, | CH₃—SiH₃, |
| Dimethylsilane, | (CH₃)₂—SiH₂, |
| Trimethylsilane (TMS), | (CH₃)₃—SiH, |
| Tetramethylsilane, | (CH₃)₄—Si, |
| Ethylsilane, | CH₃—CH₂—SiH₃, |
| Disilanomethane, | SiH₃—CH₂—SiH₃, |
| Bis(methylsilano)methane, | CH₃—SiH₂—CH₂—SiH₂—CH₃, |
| 1,2-disilanoethane, | SiH₃—CH₂—CH₂—SiH₃, |
| 1,2-bis(methylsilano)ethane, | CH₃—SiH₂—CH₂—CH₂—SiH₂—CH₃, |
| 2,2-disilanopropane, | SiH₃—C(CH₃)₂—SiH₃, |
| 1,3,5-trisilano-2,4,6-trimethylene, | —(—SiH₂—CH₂—)₃— (cyclic), |
| Diethylsilane | (C₂H₅)₂SiH₂, |
| Diethylmethylsilane | (C₂H₅)₂SiH(CH₃), |
| Propylsilane, | C₃H₇SiH₃, |
| Vinylmethylsilane | (CH₂=CH)(CH₃)SiH₂, |
| Divinyldimethylsilane (DVDMS) | (CH₂=CH)₂(CH₃)₂Si, |
| 1,1,2,2-tetramethyldisilane | HSi(CH₃)₂—Si(CH₃)₂H, |
| Hexamethyldisilane | (CH₃)₃Si—Si(CH₃)₃, |
| 1,1,2,2,3,3-hexamethyltrisilane | H(CH₃)₂Si—Si(CH₃)₂—SiH(CH₃)₂, |
| 1,1,2,3,3-pentamethyltrisilane | H(CH₃)₂Si—SiH(CH₃)—SiH(CH₃)₂, |
| Dimethyldisilanoethane | CH₃—SiH₂—(CH₂)₂—SiH₂—CH₃, |
| Dimethyldisilanopropane | CH₃—SiH₂—(CH₂)₃—SiH₂—CH₃, |
| Tetramethyldisilanoethane | (CH)₂—SiH—(CH₂)₂—SiH—(CH)₂, |
| Tetramethyldisilanopropane | (CH₃)₂—SiH—(CH₂)₃—SiH—(CH₃)₂, |

Suitable organosilicon compounds may include organosilicon compounds having carbon to silicon atom ratios (C:Si) of 5:1 or greater, such as 8:1 or 9:1. Alkyl functional groups having higher carbon alkyl groups, such as ethyl and iso-propyl functional groups, for example, dimethylisopropylsilane (5:1), diethylmethylsilane (5:1), tetraethylsilane (8:1), dibutylsilanes (8:1), tripropylsilanes (9:1), may be used. Cyclical organosilicons, such as cyclopentylsilane (5:1) and cyclohexylsilane (6:1), including cyclical compounds having alkyl groups, such as ethylcyclohexylsilane (8:1) and propylcyclohexylsilanes (9:1) may also be used for the deposition of silicon carbide layers.

Phenyl containing organosilicon compounds, such as phenylsilanes may also be used for depositing the silicon carbide materials and generally include the structure:

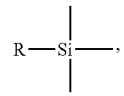

wherein R is a phenyl group. The compound may further have at least one silicon-hydrogen bond and may further have one or more organic functional groups, such as alkyl groups, cyclical groups, vinyl groups, or combinations thereof. For example, suitable phenyl containing organosilicon compounds generally includes the formula SiH$_a$(CH$_3$)$_b$(C$_6$H$_5$)$_c$, wherein a is 0 to 3, b is 0 to 3, and c is 1 to 4, and a+b+c is equal to 4. Examples of suitable compounds derived from this formula include diphenylsilane (DPS), dimethylphenylsilane (DMPS), diphenylmethylsilane, phenylmethylsilane, and combinations thereof. Preferably used are phenyl containing organosilicon compounds with b is 1 to 3 and c is 1 to 3. The most preferred phenyl organosilicon compounds for deposition as barrier layer materials include organosilicon compounds having the formula SiH$_a$(CH$_3$)$_b$(C$_6$H$_5$)$_c$, wherein a is 1 or 2, b is 1 or 2, and c is 1 or 2. Examples of preferred phenyl compounds include dimethylphenylsilane and diphenylmethylsilane.

The processing gas may further include hydrogen gas, an inert gas, or an combination thereof. Suitable inert gases include a noble gas selected from the group of argon, helium, neon, xenon, or krypton, and combinations thereof, and nitrogen gas (N₂). The hydrogen gas is generally added at a molar ratio of organosilicon compound to hydrogen gas of between about 1:1 and about 10:1, such as between about 1:1 and about 6:1. Preferred deposition processes for oxygen-free organosilicon compounds and hydrogen gas has a molar ratio of oxygen-free organosilicon compound to hydrogen gas of between about 1:1 and about 1.5:1. Generally, the flow rate of the inert gas, hydrogen gas, or combinations thereof, are introduced into the processing chamber at a flow rate between about 50 sccm and about 20,000 sccm.

One embodiment of a deposition of nitrated silicon carbide layer comprises supplying an organosilicon precursor, for example trimethylsilane, at a flow rate between about 10 sccm and about 1500 sccm (or between about 10 milligrams/ minute (mgm) and about 1500 mgm), for example, between about 50 sccm and about 800 sccm, optionally, supplying dopants including oxygen containing compounds and/or nitrogen containing compounds, to a processing chamber at a flow rate between about 10 sccm and about 2500 sccm, for example, between about 500 sccm and about 2000 sccm, and optionally, supplying a hydrogen to a processing chamber at a flow rate between about 1 sccm and about 5,000 sccm and supplying an inert (noble) gas to a processing chamber at a flow rate between about 1 sccm and about 20,000 sccm, maintaining a chamber pressure between about 100 milliTorr and about 100 Torr, for example, between about 2.5 Torr and about 9 Torr, maintaining a heater temperature between about 0° C. and about 500° C., for example, between about 250° C. and about 450° C., positioning a gas distributor, or "showerhead", between about 200 mils and about 1000 mils, for example between 200 mils and 500 mils from the substrate surface, and optionally, generating a plasma.

The plasma may be generated by applying a power density ranging between about 0.03 W/cm$^2$ and about 6.4 W/cm$^2$, which is a RF power level of between about 10 W and about 2000 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm and about 2.8 W/cm$^2$, which is a RF power level of between about 10 W and about 2000 W for a 300 mm substrate, for example, between about 500 W and about 1100 W at a high frequency such as between 13 MHz and 14 MHz, for example, 13.56 MHz.

The power may be applied from a dual-frequency RF power source having a high frequency with a frequency in a range of about 10 MHz and about 30 MHz and a low frequency with a frequency in a range of between about 100 KHz and about 500 KHz. The dual frequency generally has a high frequency power greater than the lower frequency power. An example of a dual frequency RF power application includes a first RF power with a frequency in a range of about 10 MHz and about 30 MHz at a power, for example, in a range of about 100 watts to about 1000 watts and at least a second RF power with a frequency in a range of between about 100 KHz and about 500 KHz as well as a power in a range of about 1 watt to about 200 watts.

Example processes for depositing a phenyl containing silicon carbide layer is disclosed in U.S. patent application Ser. No. 10/010,950, filed on Nov. 13, 2001, and U.S. patent application Ser. No. 10/342,079, filed on Jan. 13, 2002, which are incorporated by reference to the extent not inconsistent with the claims and disclosure described herein.

Nitrogen doped silicon carbide may be deposited by the reaction of the organosilicon compounds described herein with a nitrogen source, a nitrogen-containing compound. The nitrogen source may be a nitrogen-containing gas, for example, ammonia ($NH_3$), nitrogen gas ($N_2$), a mixture of nitrogen gas and hydrogen gas, or combinations thereof, in the processing gas. The nitrogen doped silicon carbide layer generally includes less than about 20 atomic percent (atomic %) of nitrogen. The nitrogen source may be introduced into the processing chamber at a flow rate between about 50 sccm and about 10,000 sccm. The nitrogen doped silicon carbide layer may further be oxygen doped by the processes described herein.

Alternatively, the nitrogen source may comprise silicon and nitrogen containing compounds. Suitable silicon and nitrogen containing compounds include compounds having Si—N—Si bonding groups, such as silazane compounds, may be used in the processing gas for doping the deposited silicon carbide material with nitrogen. Compounds having bonded nitrogen, such as in the silazane compounds, can improve the hardness of layers as well as reduced the current leakage of the layers. Examples of suitable silizane compounds includes aliphatic compounds, such as hexamethyldisilazane and divinyltetramethyldisilizane, as well as cyclic compounds, such as hexamethylcyclotrisilazane.

One embodiment of a deposition of nitrated silicon carbide layer comprises supplying an organosilicon precursor, for example trimethylsilane, at a flow rate between about 10 sccm and about 1000 sccm, for example, between about 50 sccm and about 500 sccm, supplying reducing compounds including nitrogen containing compounds, to a processing chamber at a flow rate between about 100 sccm and about 2500 sccm, for example, between about 500 sccm and about 2000 sccm, and optionally, supplying a hydrogen and/or an inert (noble) gas to a processing chamber at a flow rate between about 1 sccm and about 10,000 sccm respectively, optionally supplying an oxygen-containing compound to a processing chamber at a flow rate between about 100 sccm and about 2500 sccm for an oxygen and nitrogen doped silicon carbide layer, for example, between about 500 sccm and about 2000 sccm, maintaining a chamber pressure between about 100 milliTorr and about 100 Torr, for example, between about 2.5 Torr and about 9 Torr, maintaining a heater temperature between about 100° C. and about 5000°C., for example, between about 250° C. and about 450° C., positioning a gas distributor, or "showerhead", between about 200 mils and about 1000 mils, for example between 200 mils and 400 mils from the substrate surface, and optionally, generating a plasma.

The plasma may be generated by applying a power density ranging between about 0.03 W/cm and about 6.4 W/cm$^2$, which is a RF power level of between about 10 W and about 2000 W for a 200 mm substrate, for example, between about 500 W and about 1100 W at a high frequency such as between 13 MHz and 14 MHz, for example, 13.56 MHz. The plasma may be generated by applying a power density ranging between about 0.01 W/cm$^2$ and about 2.8 W/cm$^2$, which is a RF power level of between about 10 W and about 2000 W for a 300 mm substrate, for example, between about 100 W and about 1100 W at a high frequency such as between 13 MHz and 14 MHz, for example, 13.56 MHz.

The power may be applied from a dual-frequency RF power source having a high frequency with a frequency in a range of about 10 MHz and about 30 MHz and a low frequency with a frequency in a range of between about 100 KHz and about 500 KHz. The dual frequency generally has a high frequency power greater than the lower frequency power. An example of a dual frequency RF power application includes a first RF power with a frequency in a range of about 10 MHz and about 30 MHz at a power, for example, in a range of about 100 watts to about 1000 watts and at least a second RF power with a frequency in a range of between about 100 KHz and about 500 KHz as well as a power in a range of about 1 watt to about 200 watts.

Example processes for depositing a nitrogen containing silicon carbide layer is disclosed in U.S. patent application Ser. No. 09/627,667, filed on Jul. 28, 2000, and U.S. Pat. Ser. No. 6,537,733, issued on Mar. 25, 2003, which are incorporated by reference to the extent not inconsistent with the claims and disclosure described herein.

Silicon carbide layers may further include oxygen. Oxygen-doped silicon carbide layers typically include less than about 15 atomic percent (atomic %) of oxygen, preferably having between about 3 atomic % and about 10 atomic % of oxygen. Oxygen doped silicon carbide layers may be deposited with oxygen containing compounds including oxygen and carbon containing compounds, such as oxygen containing gases and oxygen containing organosilicon compounds. The oxygen-containing gas and the oxygen-containing organosilicon compound described herein are considered non-oxidizing gases as compared to oxygen or ozone. Materials that are described as silicon oxycarbide or carbon-doped silicon oxide generally comprises about 15 atomic % or greater of oxygen in the layer and are deposited from oxidizing gases.

Preferred oxygen-containing gases generally have the formula $C_xH_yO_z$, with x being between 0 and 2, Y being between 0 and 2, where X+Y is at least 1, and Z being between 1 and 3, wherein X+Y+Z is 3 or less. The oxygen-containing gas may include carbon dioxide, carbon monoxide, or combinations thereof; and may additionally include water. The oxygen-containing gas is typically an inorganic material.

Alternatively, oxygen-doped silicon carbide layers may be deposited with oxygen-containing organosilicon compounds to modify or change desired layer properties by controlling the oxygen content of the deposited silicon carbide layer. Suitable oxygen-containing organosilicon compounds include oxygen-containing aliphatic organosilicon compounds, oxygen-containing cyclic organosilicon compounds, or combinations thereof. Oxygen-containing aliphatic organosilicon compounds have linear or branched structures comprising one or more silicon atoms and one or more carbon atoms, and the structure includes silicon-oxygen bonds.

Oxygen-containing cyclic organosilicon compounds typically have a ring comprising three or more silicon atoms and the ring may further comprise one or more oxygen atoms. Commercially available oxygen-containing cyclic organosilicon compounds include rings having alternating silicon and oxygen atoms with one or two alkyl groups bonded to each silicon atom. Preferred oxygen-containing organosilicon compounds are cyclic compounds.

One class of oxygen-containing organosilicon compounds include compounds having Si—O—Si bonding groups, such as organosiloxane compounds. Compounds with siloxane bonds provide silicon carbide layers with bonded oxygen that can reduce the dielectric constant of the layer as Well as reduce the current leakage of the layer.

Suitable oxygen-containing organosilicon compounds include, for example, one or more of the following compounds:

and fluorinated hydrocarbon derivatives thereof. The above lists are illustrative and should not be construed or interpreted as limiting the scope of the invention.

When oxygen-containing organosilicon compounds and oxygen-free organosilicon compounds are used in the same processing gas, a molar ratio of oxygen-free organosilicon compounds to oxygen-containing organosilicon compounds between about 4:1 and about 1:1 is generally used. An example process for depositing an oxygen containing silicon carbide layer is disclosed in U.S. patent application Ser. No. 10/196,498, filed on Jul. 15, 2002, which is incorporated by reference to the extent not inconsistent with the claims and disclosure described herein.

One embodiment of a deposition of an oxygen doped silicon carbide layer comprises supplying an organosilicon precursor, for example trimethylsilane, at a flow rate between about 10 sccm and about 1000 sccm, for example, between about 50 sccm and about 500 sccm, supplying an inert (noble) gas to a processing chamber at a flow rate between about 1 sccm and about 10,000 sccm, supplying an oxygen-containing compound to a processing chamber at a flow rate between about. 100 sccm and about 2500 sccm, for example, between about 500 sccm and about 2000 sccm, maintaining a chamber pressure between about 100 milli-Torr and about 100 Torr, for example, between about 2 Torr and about 9 Torr, maintaining a heater temperature between about 100° C. and about 500° C., for example, between about 250°C. and about 450° C., positioning a gas distributor, or "showerhead", between about 200 mils and about 1000 mils, for example between 200 mils and 400 mils from the substrate surface, and optionally, generating a plasma.

The plasma may be generated by applying a power density ranging between about 0.03 $W/cm^2$ and about 6.4 $W/cm^2$, which is a RF power level of between about 10 W and about 2000 W for a 200 mm substrate, for example, between about 100 W and about 1100 W at a high frequency such as between 13 MHz and 14 MHz, for example, 13.56 MHz. The plasma may be generated by applying a power density ranging between about 0.01 $W/cm^2$ and about 2.8 $W/cm^2$, which is a RF power level of between about 10 W and about 2000 W for a 300 mm substrate, for example, between about 100 W and about 1100 W at a high frequency such as between 13 MHz and 14 MHz, for example, 13.56 MHz.

The power may be applied from a dual-frequency RF power source having a high frequency with a frequency in a range of about 10 MHz and about 30 MHz and a low frequency with a frequency in a range of between about 100 KHz and about 500 KHz. The dual frequency generally has a high frequency power greater than the lower frequency

| | |
|---|---|
| Dimethyldimethoxysilane (DMDMOS), | $(CH_3)_2$—Si—$(OCH_3)_2$, |
| Diethoxymethylsilane (DEMS), | $(CH_3)$—SiH—$(OCH_3)_2$, |
| 1,3-dimethyldisiloxane, | $CH_3$—$SiH_2$—O—$SiH_2$—$CH_3$, |
| 1,1,3,3-tetramethyldisiloxane (TMDSO), | $(CH_3)_2$—SiH—O—SiH—$(CH_3)_2$, |
| Hexamethyldisiloxane (HMDS), | $(CH_3)_3$—Si—O—Si—$(CH_3)_3$, |
| Hexamethoxydisiloxane (HMDSO), | $(CH_3O)_3$—Si—O—Si—$(OCH_3)_3$, |
| 1,3-bis(silanomethylene)disiloxane, | $(SiH_3$—$CH_2$—$SiH_2$—$)_2$—O, |
| Bis(1-methyldisiloxanyl)methane, | $(CH_3$—$SiH_2$—O—$SiH_2$—$)_2$—$CH_2$, |
| 2,2-bis(1-methyldisiloxanyl)propane, | $(CH_3$—$SiH_2$—O—$SiH_2$—$)_2$—$C(CH_3)$, |
| 1,3,5,7-tetramethylcyclotetrasiloxane (TMCTS), | —(—$SiHCH_3$—O—$)_4$— (cyclic), |
| Octamethylcyclotetrasiloxane (OMCTS), | —(—$Si(CH_3)_2$—O—$)_4$— (cyclic), |
| 1,3,5,7,9-pentamethylcyclopentasiloxane, | —(—$SiHCH_3$—O—$)_5$— (cyclic), |
| 1,3,5,7-tetrasilano-2,6-dioxy-4,8-dimethylene, | —(—$SiH_2$—$CH_2$—$SiH_2$—O—$)_2$— (cyclic), |
| Hexamethylcyclotrisiloxane | —(—$Si(CH_3)_2$—O—$)_3$— (cyclic), | power. An example of a dual frequency RF power application includes a first RF power with a frequency in a range of about 10 MHz and about 30 MHz at a power, for example, in a range of about 100 watts to about 1000 watts and at least a second RF power with a frequency in a range of between about 100 KHz and about 500 KHz as well as a power in a range of about 1 watt to about 200 watts.

An example process for depositing an oxygen containing silicon carbide layer is disclosed in U.S. patent application Ser. No. 10/196,498, filed on Jul. 15, 2002, which is incorporated by reference to the extent not inconsistent with the claims and disclosure described herein.

The silicon carbide layer may also be doped with boron and/or phosphorus to improve layer properties, and generally includes less than about 15 atomic percent (atomic %) or less of dopants. Boron doping of the low k silicon carbide layer may be performed by introducing borane ($BH_3$), or borane derivatives thereof, such as diborane ($B_2H_6$), into the chamber during the deposition process. Boron doping of the silicon carbide layer preferably comprises between about 0.1 wt. % and about 4 wt. % of boron.

Phosphorus containing dopants may be used in the processing gases at a ratio of dopant to organosilicon compound between about 1:5 or greater, such as between about 1:5 and about 1:100. Phosphorus doping of the low k silicon carbide layer may be performed by introducing phosphine ($PH_3$), triethylphosphate (TEPO), triethoxyphosphate (TEOP), trimethyl phosphine (TMP), triethyl phosphine (TEP), and combinations thereof, into the chamber during the deposition process. It is believed that dopants may reduce the dielectric constant of the deposited silicon carbide material. The doped silicon carbide layer may comprise between about 0.1 wt. % and about 15 wt. % of phosphorus, for example, between about 1 wt. % and about 4 wt. % of phosphorus.

An example process for depositing a boron and/or phosphorus silicon carbide layer is disclosed in U.S. patent application Ser. No. 10/342,079, filed on Jan. 13, 2003, which is incorporated by reference to the extent not inconsistent with the claims and disclosure described herein.

Additional materials, such as an organic compounds, may also be present during the deposition process to modify or change desired layer properties. For example, organic compounds, such as aliphatic hydrocarbon compounds may also be used in the processing gas to increase the carbon content of the deposited silicon carbide materials. Suitable aliphatic hydrocarbon compounds include compounds having between one and about 20 adjacent carbon atoms. The hydrocarbon compounds can include adjacent carbon atoms that are bonded by any combination of single, double, and triple bonds.

Suitable organic compounds may include alkenes and alkynes having two to about 20 carbon atoms, such as ethylene, propylene, acetylene, and butadiene. Further examples of suitable hydrocarbons include t-butylethylene, 1,1,3,3-tetramethylbutylbenzene, t-butylether, metyl-methacrylate (MMA), t-butylfurfurylether, and combinations thereof. Organic compounds containing functional groups including oxygen and/or nitrogen containing functional groups may also be used. For example, alcohols, including ethanol, methanol, propanol, and iso-propanol, may be used for depositing the silicon carbide material.

Silicon carbide material are generally deposited by supplying an organosilicon compound to a plasma processing chamber at a flow rate between about 10 sccm and about 1500 sccm, supplying a dopants, such as a nitrogen containing compounds including as ammonia and oxygen containing compounds, at a flow rate between about 10 sccm and about 2500 sccm, supplying carrier gases, such as an inert gas and/or hydrogen, to the processing chamber at a flow rate between about 10 sccm and about 10000 sccm, respectively, maintaining the chamber at a heater temperature between about 0° C. and about 500° C., maintaining a chamber pressure between about 100 milliTorr and about 100 Torr, positioning a gas distributor between about 200 mils and about 700 mils from the substrate surface, and generating a plasma.

The plasma may be generated power levels may be by applying a power density ranging between about 0.03 W/cm$^2$ and about 6.4 W/cm$^2$, which is a RF power level of between about 10 W and about 2000 W for a 200 mm substrate, for example, between about 100 W and about 400 W at a high frequency such as between 13 MHz and 14 MHz, for example, 13.56 MHz. The plasma may be generated power levels may be by applying a power density ranging between about 0.01 W/cm$^2$ and about 2.8 W/cm$^2$, which is a RF power level of between about 10 W and about 2000 W for a 300 mm substrate, for example, between about 100 W and about 400 W at a high frequency such as between 13 MHz and 14 MHz, for example, 13.56 MHz. The RF power can be provided continuously or in short duration cycles wherein the power is on at the stated levels for cycles less than about 200 Hz and the on cycles total between about 10% and about 30% of the total duty cycle. Alternatively, all plasma generation may be performed remotely, with the generated radicals introduced into the processing chamber for plasma treatment of a deposited material or deposition of a material layer.

Alternatively, the plasma may be generated by a dual-frequency RF power source. The power may be applied from a dual-frequency RF power source a first RF power with a frequency in a range of about 10 MHz and about 30 MHz at a power, for example, in a range of about 100 watts to about 1000 watts and at least a second RF power with a frequency in a range of between about 100 KHz and about 500 KHz as well as a power, for example, in a range of about 1 watt to about 200 watts. The above process parameters provide a deposition rate for the silicon carbide layer in the range of about 500 Å/min to about 20,000 Å/min, such as a range between about 100 Å/min and about 3000 Å/min.

Suitable processing systems for performing the processes described herein are a DxZ™ chemical vapor deposition chamber or Producer™ processing system, both of which are commercially available from Applied Materials, Inc., Santa Clara, Calif.

The above process parameters provide a deposition rate for the silicon carbide layer or nitrogen doped silicon carbide layer in the range of about 500 Å/min to about 20,000 Å/min, such as a range between about 100 Å/min and about 3000 Å/min, when implemented on a 200 mm (millimeter) substrate in a deposition chamber available from Applied Materials, Inc., of Santa Clara, Calif.

Post-Deposition Treatments

The deposited silicon carbide material may also be exposed to an anneal, a plasma treatment; an e-beam process, an ultraviolet treatment process, or a combination of treatments. The post-deposition treatments may be performed in situ with the deposition of the silicon carbide material without breaking vacuum in a processing chamber or processing system.

Annealing the deposited material may comprise exposing the substrate at a temperature between about 100° C. and about 400° C. for between about 1 minute and about 60 minutes, preferably at about 30 minutes, to reduce the moisture content and increase the solidity and hardness of the dielectric material. Annealing is preferably performed after the deposition of a subsequent material or layer that prevents shrinkage or deformation of the dielectric layer. The annealing process is typically formed using inert gases, such as argon and helium, but may also include hydrogen or other non-oxidizing gases. The above described annealing process is preferably used for low dielectric constant materials deposited from processing gases without meta-stable compounds. The anneal process is preferably performed prior to the subsequent deposition of additional materials. Preferably, an in-situ (i.e., inside the same chamber or same processing system without breaking vacuum) post treatment is performed.

The annealing process is preferably performed in one or more cycles using helium. The annealing process may be performed more than once, and variable amounts of helium and hydrogen may be used in multiple processing steps or annealing steps. The anneal energy may be provided by the use of heat lamps, infer-red radiation, such as IR heating lamps, or as part of a plasma anneal process. Alternatively, a RF power may be applied to the annealing gas between about 200 W and about 1,000 W, such as between about 200 W and about 800 W, at a frequency of about 13.56 MHz for a 200 mm substrate.

Alternatively, or additionally, the deposited silicon carbide layer may be plasma treated to remove contaminants or other wise clean the exposed surface of the silicon carbide layer prior to subsequent deposition of materials thereon. The plasma treatment may be performed in the same chamber used to deposit the silicon and carbon containing material. The plasma treatment is also believed to improve layer stability by forming a protective layer of a higher density material than the untreated silicon carbide material. The higher density silicon carbide material is believed to be more resistive to chemical reactions, such as forming oxides when exposed to oxygen, than the untreated silicon carbide material. The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The inert gas and/or reducing gas is introduced into the processing chamber at a flow rate between about 500 sccm and about 3000 sccm, preferably between about 1000 sccm and about 2500 sccm of hydrogen, and generating a plasma in the processing chamber.

The plasma may be generated using a power density ranging between about 0.03 W/cm and about 3.2 W/cm$^2$, which is a RF power level of between about 10 W and about 1000 W for a 200 mm substrate. Preferably, at a power level of about 100 watts for a silicon carbide material on a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. Alternatively, the RF power may also be provided at low frequencies, such as 356 kHz, for plasma treating the depositing silicon carbide layer.

The processing chamber is preferably maintained at a chamber pressure of between about 1 Torr and about 12 Torr, for example about 3 Torr. The substrate is preferably maintained at a temperature between about 200° C. and about 450° C., preferably between about 290° C. and about 400° C., during the plasma treatment. A heater temperature of about the same temperature of the silicon carbide deposition process, for example about 290° C., may be used during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 500 mils from the substrate surface. The gas distributor may be positioned between about 300 mils and about 600 mils during the plasma treatment.

The hydrogen containing plasma treatment is believed to further reduce the dielectric constant of the low k dielectric layer by about 0.1 or less. The plasma treatment is believed to clean contaminants from the exposed surface of the silicon carbide material and may be used to stabilize the layer, such that it becomes less reactive with moisture and/or oxygen under atmospheric condition as well as the adhesion of layers formed thereover.

One example of a post deposition plasma treatment for a silicon carbide layer includes introducing ammonia at a flow rate of 950 sccm into the processing chamber, maintaining the chamber at a heater temperature of about 3500° C., maintaining a chamber pressure of about 3.7 Torr, positioning a gas distributor at about 280 mils from the substrate surface, and applying a RF power of about 300 watts at 13.56 MHz for about two seconds.

However, it should be noted that the respective parameters may be modified to perform the plasma processes in various chambers and for different substrate sizes, such as 300 mm substrates. An example of a plasma treatment for a silicon and carbon containing layer is further disclosed in U.S. patent application Ser. No. 09/336,525, entitled, "Plasma treatment to Enhance adhesion and to Minimize Oxidation of Carbon-Containing Layers," filed on Jun. 18, 1999, which is incorporated herein by reference to the extent not inconsistent with the disclosure and claimed aspects of the invention described herein.

Alternatively, the silicon carbide layer may also be treated by depositing a silicon carbide cap layer or silicon oxide cap layer prior to depositing a resist material. The cap layer may be deposited at a thickness between about 100 Å and about 500 Å. The use of a cap layer is more fully described in co-pending U.S. patent application Ser. No. 09/977,008, entitled "Method Of Eliminating Resist Poisoning In Damascene Applications", filed on Oct. 11, 2001, which is incorporated herein by reference to the extent not inconsistent with the claimed aspects and disclosure described herein.

In another aspect of the invention, the deposited silicon carbide material may be cured by an electronic beam (e-beam) technique. Silicon carbide material cured using an e-beam technique has shown an unexpected reduction in k value and an unexpected increase in hardness, not capable with conventional curing techniques. The e-beam treatment may be performed in situ within the same processing system, for example, transferred from one chamber to another without break in a vacuum. The following e-beam apparatus and process are illustrative, and should not be construed or interpreted as limiting the scope of the invention.

The temperature at which the electron beam apparatus 200 operates ranges from about −200 degrees Celsius to about 600 degrees Celsius, e.g., about 400 degrees Celsius. An e-beam treatment of a silicon carbide layer may comprise the application or exposure to between about 1 micro coulombs per square centimeter ($\mu C/cm^2$) and about 6,000 $\mu C/cm^2$, for example, between about 1 $\mu C/cm^2$ and about 400 μC/cm², and more preferably less than about 200 μC/cm², such as about 70 μC/cm², at energy ranges between about 0.5 kiloelectron volts (KeV) and about 30 KeV, for example between about 1 KeV and about 3 kiloelectron volts (KeV). The electron beams are generally generated at a pressure of about 1 mTorr to about 200 mTorr.

The gas ambient in the electron beam chamber 220 may be an inert gas, including nitrogen, helium, argon, xenon, an oxidizing gas including oxygen, a reducing gas including hydrogen, a blend of hydrogen and nitrogen, ammonia, or any combination of these gases. The electron beam current ranges from about 1 mA to about 40 mA, and more preferably from about 5 mA to about 20 mA. The electron beam may cover an area from about 4 square inches to about 700 square inches. Although any e-beam device may be used, one exemplary device is the EBK chamber, available from Applied Materials, Inc., of Santa Clara Calif.

An example of an e-beam process is as follows. A substrate having a 3000 Å thick layer is exposed to an e-beam at a chamber temperature about 400 degrees Celsius, an applied electron beam energy of about 3.5 KeV, and at an electron beam current of about 5 mA, with an exposure dose of the electron beam of about 500 mC/cm².

The deposited silicon carbide material may then be cured by an ultraviolet curing technique. Silicon carbide material cured using the ultraviolet curing technique has shown an improved barrier layer properties and reduced and minimal resist poisoning. The ultraviolet curing technique may be performed in situ within the same processing chamber or system, for example, transferred from one chamber to another without break in a vacuum. The following ultraviolet curing technique is illustrative, and should not be construed or interpreted as limiting the scope of the invention.

Exposure to an ultraviolet radiation source may be performed as follows. The substrate is introduced into a chamber, which may include the deposition chamber, and a deposited silicon carbide layer, including nitrogen-doped silicon carbide materials, is exposed to between about 0.01 milliWatts/cm² and about 1 watts/cm² of ultraviolet radiation, for example, between about 0.1 milliWatts/cm² and about 10 milliwatts/cm². The ultraviolet radiation may comprise a range of ultraviolet wavelengths, and include one or more simultaneous wavelength. Suitable ultraviolet wavelengths include between about 1 nm and about 400 nm, and may further include optical wavelengths up to about 600 or 780 nm. The ultraviolet wavelengths between about 1 nm and about 400 nm, may provide a photon energy (electro-Volts) between about 11.48 eV and about 3.5 (eV). Preferred ultraviolet wavelengths include between about 100 nm and about 350 nm.

Further, the ultraviolet radiation application may occur at multiple wavelengths, a tunable wavelength emission and tunable power emission, or a modulation between a plurality of wavelengths as desired, and may be emitted from a single UV lamp or applied from an array of ultraviolet lamps. Examples of suitable UV lamps include a Xe filled Zeridex™ UV lamp, which emits ultraviolet radiation at a wavelength of about 172 nm or the Ushio Excimer UV lamp, or a Hg Arc Lamp, which emits ultraviolet radiation at wave. The deposited silicon carbide layer is exposed to the ultraviolet radiation for between about 10 seconds and about 600 seconds.

During processing, the temperature of the processing chamber may be maintained at between about 0° C. and about 450° C., e.g., between about 20° C. and about 400° C. degrees Celsius, for example about 25° C., and at a chamber pressure between vacuum, for example, less than about 1 mTorr up to about atmospheric pressure, i.e., 760 Torr, for example at about 100 Torr. The source of ultraviolet radiation may be between about 100 mils and about 600 mils from the substrate surface. Optionally, an ultraviolet curing processing gas may be introduced during the ultraviolet technique. Suitable curing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_xH_y$, $C_xF_y$, $C_xF_yH_z$, or combinations thereof, with x an integer between 1 and 6, y is an integer between 4 and 14, and z is an integer between 1 and 3.

An example of an ultraviolet process is as follows. A substrate having a nitrogen doped silicon carbide layer is exposed to ultraviolet radiation at a chamber temperature about 25° C., an applied power of about 10 mW/cm² at a wavelength of about 172 nm for about 120 seconds.

Hermeticity

The silicon carbide layers, such as the nitrogen doped silicon carbide (SiCN) layer and the oxygen doped silicon carbide (SiCO) layer described herein were deposited and tested for hermeticity. Hermeticity is quantified by a stress test. The stress test includes depositing a layer of material to be examined on top of a layer of TEOS oxide which has a high tensile stress and then subjecting the stack to 85° C. and 85% humidity for 17 hours. As the tensile TEOS oxide layers absorbs moisture, the TEOS oxide layer stress changes to become more compressive, so a small stress change correlates to low moisture absorption and a large stress correlates in increasing non-hermetic layers.

Based on experimental data for layers deposited under varying processing conditions, hermetic nitrogen doped silicon carbide have a change in stress (delta Δ stress) of about 170 MPa or less, and for oxygen-doped silicon carbide, hermetic layers have a change in stress (delta Δ stress) of about 70 MPa or less. The change in stresses were correlated with FT-IR graphs of the SiCN and SiCO layers deposited under varying processing conditions and examined to determine composition and bonding in the deposited layers.

Figure 3:
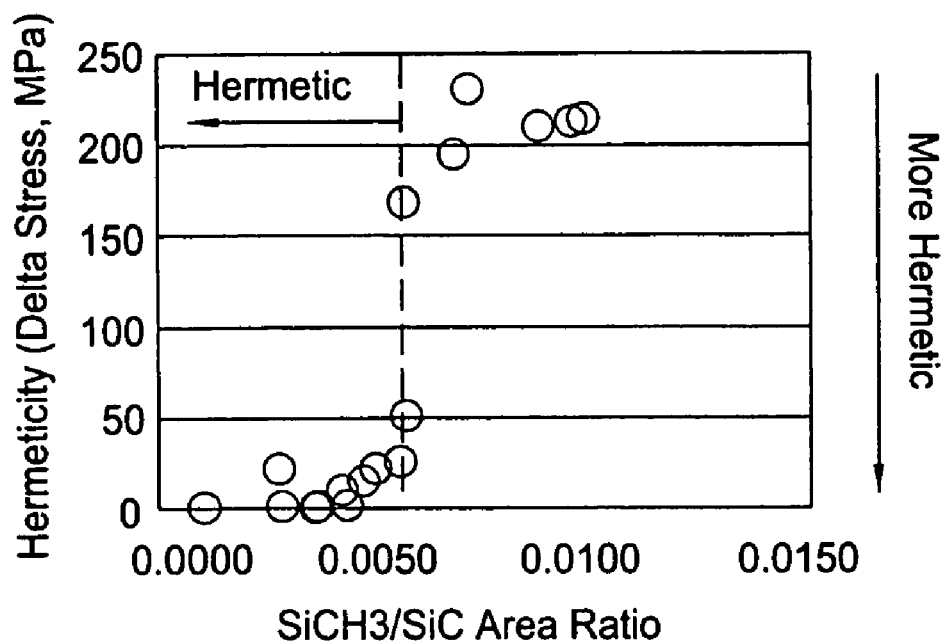
FIG. 3 is a chart of one embodiment of stress difference versus bond ration for a nitrogen doped silicon carbide film.
Figure 4:
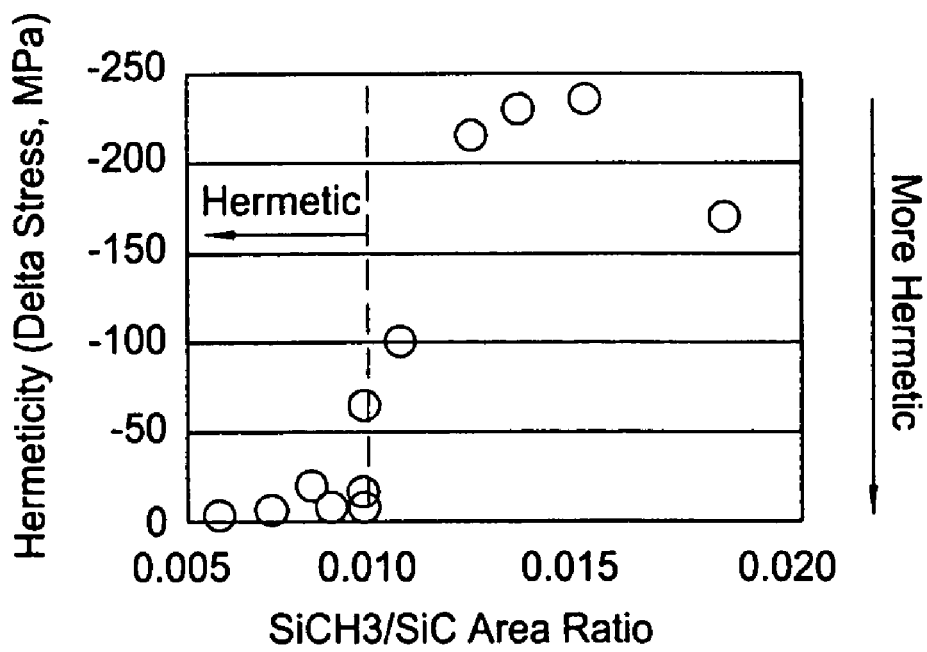
FIG. 4 is a chart of one embodiment of stress difference versus bond ration for an oxygen doped silicon carbide film.

The FT-IR spectra, of a deposited layer is analyzed to check for S—CH$_3$ and Si—C bonds. A ratio of the area under the Si—CH$_3$ and Si—C bonds (Si—CH$_3$/Si—C) of the FT-IR graphs was then plotted versus a change in stress from the experimental data. Hermetic layers were determined as having a Si—CH$_3$/Si—C area ratios of about 0.006 or less for nitrogen doped silicon carbide layers (SiCN) as shown in FIG. 3; and area ratios of about 0.009 or less for oxygen doped silicon carbide layers (SiCO) as shown in FIG. 4. The direct correlation between layer hermeticity and FT-IR spectra allows for the identification between hermeticity and Si—CH$_3$ bonds that indicate a higher concentration of Si—CH$_3$ results in a less hermetic film. As such, deposition process conditions for silicon carbide material may be optimized to deposit films which are hermetic. This further allows for determination of the respective layer thicknesses for layers of the bilayer barrier layers described herein as well as deposition conditions.

Figure 5:
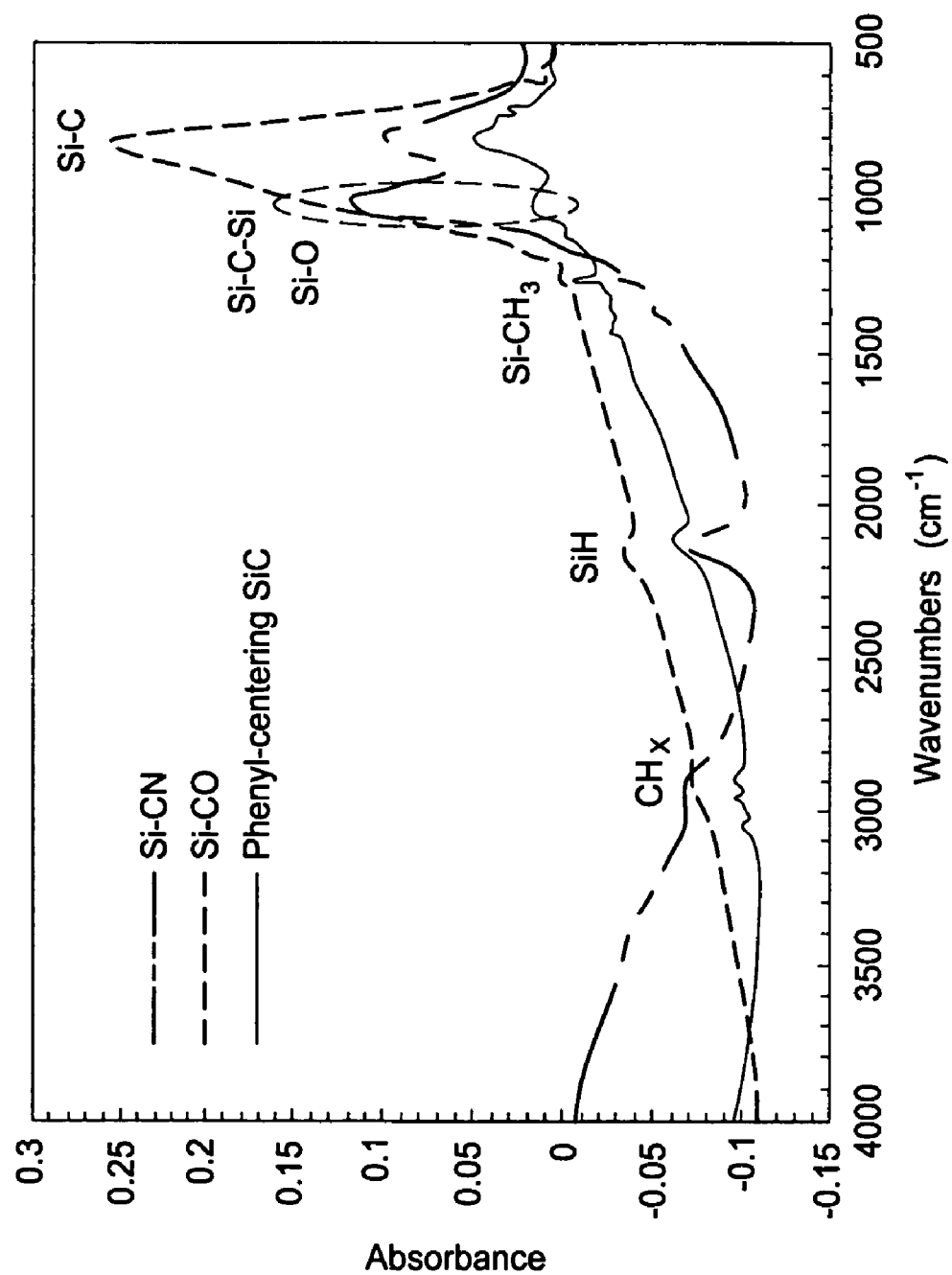
FIG. 5 is a FT-IR graph of a series of embodiments of deposited silicon carbide based materials.

Referring to FIG. 5, silicon carbide layers of nitrogen-doped silicon carbide (SiCN), oxygen doped silicon carbide (SiCO), and phenyl containing silicon carbide were deposited by the examples described herein, and FT-IR spectrums of the plotted on the same chart. As can be seen from the ET-IR chart, the nitrogen doped silicon carbide layer has the lowest Si—CH$_3$/SiC area ratio, and thus, the most hermetic layer and the phenyl containing silicon carbide layer has the highest Si—CH$_3$/SiC area ratio, and thus, a less hermetic layer. Various layers of silicon carbide based material may be deposited and compared to the chart to compare hermeticity and suitability in inclusion with the bilayer approach. For example, for a bilayer with a lower layer of increasing hermeticity and an upper layer having o lower hermeticity, the lower layer may comprise nitrogen doped silicon carbide and the upper layer may comprise oxygen doped silicon carbide and phenyl containing silicon carbide. Likewise, the lower layer may comprise oxygen doped silicon carbide and the upper layer comprises phenyl containing silicon carbide.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate, comprising:
providing substrate having conductive features formed in a dielectric material to a processing chamber;
depositing a first barrier layer comprising silicon, carbon, and nitrogen on the substrate;
depositing a second barrier layer on the first barrier layer, wherein the second barrier layer is a nitrogen free dielectric layer comprising silicon and carbon and deposited by reacting a processing gas comprising hydrogen and an oxygen-free organosilicon compound having the formula SiH$_a$(CH$_3$)$_b$(C$_6$H$_5$)$_c$, wherein a is 0 to 3, b is 0 to 3, and c is 1 to 4.

2. The method of claim 1, wherein the first barrier layer is deposited by a process comprising:
depositing a first barrier layer on the substrate by introducing a processing gas comprising a nitrogen source and an organosilicon compound into a processing chamber; and
reacting the processing gas to deposit the first barrier layer, wherein the first barrier layer has a dielectric constant less than 5.

3. The method of claim 1, further comprising depositing a dielectric layer adjacent the second barrier layer, wherein the dielectric layer comprises silicon, oxygen, and carbon and has a dielectric constant of about 3 or less.

4. The method of claim 1, further comprising depositing a resist material on the second dielectric layer.

5. The method of claim 1, wherein the first barrier layer, the second barrier layer or the dielectric layer are subjected to a curing process comprising a thermal anneal, a plasma treatment, an e-beam treatment, an ultraviolet curing technique, or combinations thereof.

6. The method of claim 1, wherein the oxygen-free organosilicon compound comprises diphenylmethylsilane, dimethylphenylsilane, or combinations thereof.

7. The method of claim 1, wherein the processing gas further comprises an inert gas selected from the group of helium, argon, and combinations thereof.

8. The method of claim 7, wherein the processing gas comprises hydrogen, helium, and dimethylphenylsilane.

9. The method of claim 1, wherein the processing gas further includes a dopant component selected from the group of a boron-containing compound, a phosphorus-containing compound, and combinations thereof.

10. The method of claim 1, wherein the reacting the processing gas comprises generating a plasma by a single-frequency RF power source or a dual-frequency RF power source.

11. The method of claim 2, wherein the organosilicon compound and the oxygen-free organosilicon compound are the same compound.

12. The method of claim 1, wherein the first barrier layer and the second barrier layer are deposited in situ in the same processing chamber or same processing system without breaking vacuum.

13. A method for processing a substrate, comprising:
providing substrate having conductive features formed in a dielectric material to a processing chamber;
depositing a first barrier layer comprising silicon, carbon, and nitrogen on the substrate;
depositing a second barrier layer on the first barrier layer, wherein the second barrier layer is a nitrogen free dielectric layer comprising silicon and carbon and deposited by reacting a processing gas comprising a carbon and oxygen containing compound and an oxygen-free organosilicon compound and has an oxygen content of less than about 15 atomic percent.

14. The method of claim 13, wherein the first barrier layer is deposited by a process comprising:
depositing a first barrier layer on the substrate by introducing a processing gas comprising a nitrogen source and an organosilicon compound into a processing chamber; and
reacting the processing gas to deposit the first barrier layer, wherein the first barrier layer has a dielectric constant less than 5.

15. The method of claim 13, further comprising depositing a dielectric layer adjacent the second barrier layer, wherein the dielectric layer comprises silicon, oxygen, and carbon and has a dielectric constant of about 3 or less.

16. The method of claim 13, further comprising depositing a resist material on the second dielectric layer.

17. The method of claim 13, wherein the first barrier layer, the second barrier layer or the dielectric layer are subjected to a curing process comprising a thermal anneal, a plasma treatment, an e-beam treatment, an ultraviolet curing technique, or combinations thereof.

18. The method of claim 13, wherein the compound comprising oxygen and carbon is selected from the group of carbon dioxide, carbon monoxide, an oxygen-containing organosilicon compound, and combinations thereof.

19. The method of claim 13, wherein the oxygen-free organosilicon compound comprises organosilicon compound having the formula SiH$_a$(CH$_3$)$_b$(C$_6$H$_5$)$_c$, wherein a is 0 to 3, b is 0 to 3, and c is 1 to 4.

20. The method of claim 13, wherein the oxygen-free organosilicon compound comprises an aliphatic or cyclical organosilicon compound having one or more methyl groups.

21. The method of claim 20, wherein the oxygen-free organosilicon compound comprises trimethylsilane, tetramethylsilane, or both.

22. The method of claim 13, wherein the processing gas further comprises an inert gas selected from the group of helium, argon, and combinations thereof.

23. The method of claim 22, wherein the processing gas comprises carbon dioxide, helium, and dimethylphenylsilane.

24. The method of claim 22, wherein the processing gas comprises carbon dioxide, helium, and trimethylsilane.

25. The method of claim 13, wherein the processing gas further includes a dopant component selected from the group of a boron-containing compound, a phosphorus-containing compound, and combinations thereof.

26. The method of claim 13, wherein the reacting the processing gas comprises generating a plasma by a single-frequency RF power source or a dual-frequency RF power source.

27. The method of claim 14, wherein the organosilicon compound and the oxygen-free organosilicon compound are the same compound.

28. The method of claim 13, wherein the first barrier layer and the second barrier layer are deposited in situ in the same processing chamber or same processing system without breaking vacuum.

29. A method for processing a substrate, comprising:
positioning the substrate in a processing chamber, wherein the substrate comprises one or more patterned low k dielectric layers and a conductive material formed therein;
initiating a plasma of a reducing compound comprising nitrogen and hydrogen in the processing chamber;
introducing an organosilicon compound in the processing chamber;
reacting the organosilicon compound with the reducing compound;
depositing a nitrogen doped silicon carbide barrier layer on the one or more patterned low k dielectric layers and conductive material; and
depositing a nitrogen free silicon carbide barrier layer on the nitrogen doped silicon carbide layer without breaking vacuum.

30. The method of claim 29, wherein the reducing compound comprises ammonia or a mixture of nitrogen gas and hydrogen gas.

31. The method of claim 29, further comprising introducing an inert gas with the reducing compound.

32. The method of claim 29, wherein the organosilicon compound is selected from the group of trimethylsilane, 2,4,6,8-tetramethylcyclotetrasiloxane, octamethylcyclotetrasiloxane, dimethylphenylsilane, diphenylmethylsilane, and combinations thereof.

33. The method of claim 29, further comprising introducing an inert gas, hydrogen gas, the reducing compound, or a combination thereof, with the organosilicon compound.

34. The method of claim 29, wherein the initiating a plasma comprises generating a plasma by a single-frequency RF power source or a dual-frequency RF power source.

35. The method of claim 29, wherein the conductive material comprises copper, doped copper, or a copper alloy.

36. The method of claim 29, wherein the one or more patterned low k dielectric layers comprise silicon carbide, doped silicon carbide, silicon oxycarbide, or combinations thereof.

37. The method of claim 29, further comprising depositing a dielectric layer adjacent the nitrogen free silicon carbide barrier layer, wherein the dielectric layer comprises silicon, oxygen, and carbon and has a dielectric constant of about 3 or less.

38. The method of claim 29, wherein the depositing a nitrogen free silicon carbide barrier layer comprises reacting a processing gas comprising hydrogen and an oxygen-free organosilicon compound having the formula $SiH_a(CH_3)_b(C_6H_5)_c$, wherein a is 0 to 3, b is 0 to 3, and c is 1 to 4.

39. The method of claim 38, wherein the oxygen-free organosilicon compound comprises diphenylmethylsilane, dimethylphenylsilane, or combinations thereof.

40. The method of claim 38, wherein the processing gas further comprises an inert gas selected from the group of helium, argon, and combinations thereof.

41. The method of claim 40, wherein the processing gas comprises hydrogen, helium, and dimethylphenylsilane.

42. The method of claim 38, wherein the processing gas further includes a dopant component selected from the group of an oxygen-containing compound, a boron-containing compound, a phosphorus-containing compound, and combinations thereof.

43. The method of claim 38, wherein the reacting the processing gas comprises generating a plasma by a single-frequency RF power source or a dual-frequency RF power source.

44. The method of claim 29, wherein the depositing a nitrogen free silicon carbide barrier layer comprises reacting a processing gas comprising a carbon and oxygen containing compound and an oxygen-free organosilicon compound and has an oxygen content of less than about 15 atomic percent.

45. The method of claim 44, wherein the compound comprising oxygen and carbon is selected from the group of carbon dioxide, carbon monoxide, an oxygen-containing organosilicon compound, and combinations thereof.

46. The method of claim 44, wherein the oxygen-free organosilicon compound comprises organosilicon compound having the formula $SiH_a(CH_3)_b(C_6H_5)_c$, wherein a is 0 to 3, b is 0 to 3, and c is 1 to 4, an aliphatic organosilicon compound having one or more methyl groups, a cyclical organosilicon compound having one or more methyl groups, or combinations thereof.

47. The method of claim 46, wherein the oxygen-free organosilicon compound comprises trimethylsilane, tetramethylsilane, diphenylmethylsilane, dimethylphenylsilane, or combinations thereof.

48. The method of claim 44, wherein the processing gas further comprises an inert gas selected from the group of helium, argon, and combinations thereof.

49. The method of claim 48, wherein the processing gas comprises carbon dioxide, helium, and dimethylphenylsilane.

50. The method of claim 48, wherein the processing gas comprises carbon dioxide, helium, and trimethylsilane.

51. The method of claim 44, wherein the processing gas further includes a dopant component selected from the group of a boron-containing compound, a phosphorus-containing compound, and combinations thereof.

52. The method of claim 44, wherein the reacting the processing gas comprises generating a plasma by a single-frequency RF power source or a dual-frequency RF power source.

* * * * *

UNITED STATES PATENT AND TRADEMARK OFFICE
CERTIFICATE OF CORRECTION

PATENT NO. : 7,091,137 B2
APPLICATION NO. : 10/888110
DATED : August 15, 2006
INVENTOR(S) : Albert Lee et al.

It is certified that error appears in the above-identified patent and that said Letters Patent is hereby corrected as shown below:

<u>In the Specification</u>
Column 1, Line 20: Please insert the following paragraph after the heading "1. Filed of the invention":

--The invention relates to the fabrication of integrated circuits, more specifically to a process for depositing dielectric layers on a substrate, and to the structures formed by the dielectric layer. --

Column 1, Line 52: Change "achieve-a" to --achieve a--

Column 2, Line 17: Change "produced" to --produce--

Column 2, Line 18: Change "as" to --has--

Column 2, Line 30: Delete the comma after "is"

Column 2, Line 58: Change "a n" to --an--

Column 4, Line 65: Delete the comma after "on"

Column 5, Line 14: Change "constant-less" to --constant less--

Column 6, Line 44: Before "oxygen-doped", change "a" to --an--

Column 8, Line 28: Delete the comma after "a"

Column 10, Line 51: Delete the second instance of "of the"

Column 13, Line 27: Change "W/cm" to --$W/cm^2$--

Column 13, Line 62: Change "10;000" to --10,000--

Column 14, Line 5: Change "reduced" to --reduce--

Column 14, Line 7: Change "includes" to --include--

Column 14, Line 35: Change "W/cm" to --$W/cm^2$--

Column 15, Line 46: Change "Well" to --well--

UNITED STATES PATENT AND TRADEMARK OFFICE
CERTIFICATE OF CORRECTION

PATENT NO. : 7,091,137 B2
APPLICATION NO. : 10/888110
DATED : August 15, 2006
INVENTOR(S) : Albert Lee et al.

It is certified that error appears in the above-identified patent and that said Letters Patent is hereby corrected as shown below:

Column 16, Line 22: Delete the period after "about"

Column 17, Line 67: Change "compounds" to --compound--

Column 17, Line 67: Delete "as"

Column 18, Line 59: Change the semicolon after "treatment" to a comma

Column 19, Line 21: Change "infer-red" to --infra-red--

Column 19, Line 29: Change "other wise" to --otherwise--

Column 19, Line 50: Change "W/cm" to --W/cm$^2$--

Column 20, Line 24: Change "3500°" to --350°--

Column 22, Line 44: Delete the comma after "spectra"

Column 22, Line 67: Change "ET-IR" to --FT-IR--

Column 23, Line 8: Change "o" to --a--

Signed and Sealed this

Twenty-eighth Day of November, 2006

JON W. DUDAS
*Director of the United States Patent and Trademark Office*